(12) United States Patent
Yoshida et al.

(10) Patent No.: US 7,649,278 B2
(45) Date of Patent: Jan. 19, 2010

(54) OPERATING DEVICE FOR ON-VEHICLE EQUIPMENT

(75) Inventors: Kazushi Yoshida, Kasumigaura (JP); Tadashi Osaka, Kashiwa (JP)

(73) Assignee: Hitachi, Ltd., Tokyo (JP)

( * ) Notice: Subject to any disclaimer, the term of this patent is extended or adjusted under 35 U.S.C. 154(b) by 315 days.

(21) Appl. No.: 11/519,943

(22) Filed: Sep. 13, 2006

(65) Prior Publication Data

US 2007/0062753 A1  Mar. 22, 2007

(30) Foreign Application Priority Data

Sep. 14, 2005  (JP) .............................. 2005-266619

(51) Int. Cl.
*B60L 3/00* (2006.01)

(52) U.S. Cl. ...................................... 307/9.1
(58) Field of Classification Search .................. 307/9.1
See application file for complete search history.

(56) References Cited

U.S. PATENT DOCUMENTS 6,148,251 A * 11/2000 Downs ......................... 701/36
2002/0029416 A1 * 3/2002 Shaw et al. .................... 4/664
2005/0073498 A1 * 4/2005 Lehtonen .................... 345/161

FOREIGN PATENT DOCUMENTS

| DE | 199 27 464 A1 | 12/2000 |
|----|---------------|---------|
| DE | 203 00 015 U 1 | 3/2003 |
| EP | 0 532 840 A2 | 3/1993 |
| GB | 1 381 947 A | 1/1975 |
| JP | 05 345569 | 12/1993 |
| JP | 09-058426 A | 3/1997 |
| JP | 09-297629 A | 11/1997 |
| JP | 2003-140810 A | 5/2003 |

OTHER PUBLICATIONS

European Search Report dated Apr. 24, 2009.

* cited by examiner

*Primary Examiner*—Fritz M Fleming
*Assistant Examiner*—Dru M Parries
(74) *Attorney, Agent, or Firm*—Crowell & Moring LLP

(57) ABSTRACT

An operating device capable of assuring safety when operating on-vehicle equipment of an automobile is implemented. The operating device includes force sensors buried in a grasping part of a steering wheel in a vehicle, a detector for detecting force acted on the grasping part on the basis of an output signal of each of the force sensors, and a controller for outputting an operating signal to a piece of the on-vehicle equipment mounted on the vehicle on the basis of a detected signal supplied from the detector. As a result, it is possible to operate force sensors and operate the on-vehicle equipment by adjusting force used to grip the steering wheel or pressing the steering wheel without letting go the driver's hold of the steering wheel.

12 Claims, 19 Drawing Sheets

FIG. 7

| SENSOR | 2A | 2B | 2C | 2D |
|---|---|---|---|---|
| REFERENCE VALUE | 4.8 | 4.9 | 5.0 | 4.4 |
| OUTPUT SIGNAL | 4.9 | 3.4 | 2.9 | 3.8 |
| DIFFERENCE VALUE | -0.1 | 1.5 | 2.1 | 0.6 |

OPERATING DEVICE FOR ON-VEHICLE EQUIPMENT

INCORPORATION BY REFERENCE

The present application claims priority from Japanese application JP2005-266619 filed on Sep. 14, 2005, the content of which is hereby incorporated by reference into this application.

BACKGROUND OF THE INVENTION

The present invention relates to an operating device for operating on-vehicle equipment such as on-automobile equipment. In particular, the present invention relates to an operating device having operating switches provided in a steering part, such as a steering wheel.

As for on-vehicle equipment such as on-automobile equipment, on-vehicle devices such as an audio device, a car navigation device, and an information terminal can be mentioned besides accessory devices such as a brake, an accelerator or a power window. Typically, foot-depressed pedals are used in operating devices such as the brake and accelerator. In operating devices for on-vehicle devices, operating switches and hand screws such as knobs attached to respective on-vehicle devices are mainly used.

For example, in JP-A-2003-140810, a haptic controller including a control provided with feeling of click or feeling of resistance according to an operating state such as a rotation quantity or a rotation direction in order to make feeling of the operating part favorable and make operation positive even in the case where the vibration of the vehicle body is large is proposed as an operating device for on-vehicle equipment.

In JP-A-09-297629, it is also proposed to mount an information terminal, such as a personal computer, on a vehicle and attach an input device, such as a keyboard, for operating the information terminal to a steering wheel.

In JP-A-09-058426, it is proposed to provide a grip-type steering wheel brake switch on a steering wheel and activate a brake according to grasping power of hand fingers of a driver who grasps the steering wheel. Specifically, in the provided steering wheel brake switch, a lever is displaced according to grasping power of the driver and a resistance value of a variable resistor is changed according to the movement of the lever. Brake force is controlled according to a value of a current that flows through the variable resistor. It is said that owing to this configuration an idle running distance corresponding to a time period required for the driver to shift a foot from an accelerator pedal to a brake pedal can be shortened at the time of, for example, full braking.

SUMMARY OF THE INVENTION

When the driver operates the operating device described in JP-A-2003-140810, however, the driver needs to let go his or her hold of the steering wheel and turn his or her eyes away from the front to operate the operating device. Therefore, it is not favorable from the viewpoint of careful driving.

Even if a keyboard is provided on the steering wheel as described in JP-A-09-297629, the driver needs to let go his or her hold of the steering wheel and turn his or her eyes away from the front to operate the operating device. Therefore, it is not favorable from the viewpoint of careful driving.

When the driver operates the grip-type steering wheel brake switch described in JP-A-09-058426, the driver does not need to let go his or her hold of the steering wheel and turn his or her eyes away from the front. Therefore, it is favorable from the viewpoint of careful driving.

According to JP-A-09-058426, however, the steering wheel brake switch is disposed in a specific region of the steering wheel. According to the taste of the driver, therefore, it is not ensured that the driver always set a finger of a hand on the steering wheel brake switch. Therefore, there is a fear that operation will not be in time at the time of full braking.

An object of the present invention is to implement an operating device capable of assuring safety when operating on-vehicle equipment of an automobile.

In order to achieve the object, an operating device for on-vehicle equipment according to the present invention includes force sensors buried in a grasping part of a steering tool in a vehicle, a detector for detecting force acted on the grasping part on the basis of an output signal of each of the force sensors, and a controller for outputting an operating signal to a piece of the on-vehicle equipment mounted on the vehicle on the basis of a detected signal supplied from the detector.

According to the present invention, it is possible to operate force sensors and operate the on-vehicle equipment by adjusting force used to grip the steering wheel or pressing the steering wheel without letting go the driver's hold of the steering tool such as a steering wheel or a steering lever. Therefore, the driver can operate the on-vehicle equipment without needing to turn his or her eyes away from the front and letting go his or her hold of the steering wheel. Therefore, safety can be assured when operating the on-vehicle equipment.

In this case, a brake, an accelerator, a power window, an audio device, a car navigation device, an on-vehicle communication system, an information terminal, and the like can be operated by providing a plurality of force sensors, or setting operating patterns obtained by combining operating sequences of a plurality of force sensors with the numbers of times of operation.

The force sensors are configured to detect force in a direction different from that of steering force, from forces of the driver's hands and fingers acted on the steering tool. In other words, the force sensors are configured to detect force in a direction substantially perpendicular to a contact face of the hands or fingers that grasp the steering tool. Specifically, the force sensors can be formed by burying a pair of conductor foils having a dielectric layer between, along a grasping face of the steering tool, and the detector can be formed to detect force acted on the grasping part, on the basis of capacitance between the pair of conductor foils. Well-known sensors such as strain sensors can be used as the force sensors.

The controller can include a decision unit for judging the detected signal to be an operating signal for the on-vehicle equipment when a signal level of the detected signal has exceeded a first preset level. As a result, it is possible to prevent ordinary grip force or pressure from falsely operating the on-vehicle equipment.

It is possible to judge the detected signal to be a brake operating signal when a signal level of the detected signal has exceeded a high preset level preset higher than the first preset level. If the operating device according to the present invention is applied to operating the brake, it is predicted that the drive typically grips the grasping part strongly when operating the brake. Therefore, the same force sensors can be used for both braking and operating another piece of the on-vehicle equipment. If a plurality of force sensors are provided, any force sensor can be used to operate the brake. Therefore, the operating device according to the present invention is suitable to the case where emergency braking is necessary. Furthermore, it is possible to shorten the idle running distance corresponding to a time period required for the driver to shift a foot from the accelerator pedal to the brake pedal at the time of full braking.

It is desirable that the controller includes a unit for rejecting inputting of the operating signal to the on-vehicle equipment when a steering signal representing that steering is being conducted by the steering tool is input. As a result, it is possible to prevent the brake from being operated at the time of steering, resulting in raised safety.

It is preferable to exhibit operating contents of a piece of the on-vehicle equipment according to each of the force sensors on a surface of a region of the grasping part in which the force sensor is buried. In addition, it is possible to provide a unit for selecting and changing over the piece of the on-vehicle equipment operated by the operating signal on the basis of the detected signal. Furthermore, it is possible to provide an input changeover unit for selecting whether to output the operating signal to the piece of the on-vehicle equipment and make the driver to conduct the selection.

An operating device for on-vehicle equipment according to the present invention includes a plurality of force sensors buried in a grasping part of a steering wheel used to steer a vehicle so as to be divided in a circumferential direction, a detector for detecting force acted on the grasping part on the basis of an output signal of each of the force sensors, and a controller for outputting an operating signal to a piece of the on-vehicle equipment mounted on the vehicle on the basis of a detected signal supplied from the detector. The controller can be formed to output the operating signal to a piece of the on-vehicle equipment on the basis of at least one of output signals of said force sensors detected by said detection means, sequences of the output signals of said force sensors, and combinations of them.

According to the present invention, safety can be assured when operating the on-vehicle equipment on an automobile.

Other objects, features and advantages of the invention will become apparent from the following description of the embodiments of the invention taken in conjunction with the accompanying drawings.

BRIEF DESCRIPTION OF THE DRAWINGS

FIG. 7 is a diagram showing an example of reference values, output signals and difference values of force sensors in the first embodiment;

DESCRIPTION OF THE EMBODIMENTS

Hereafter, embodiments of the present invention will be described with reference to the drawings.

First Embodiment

Figure 1:
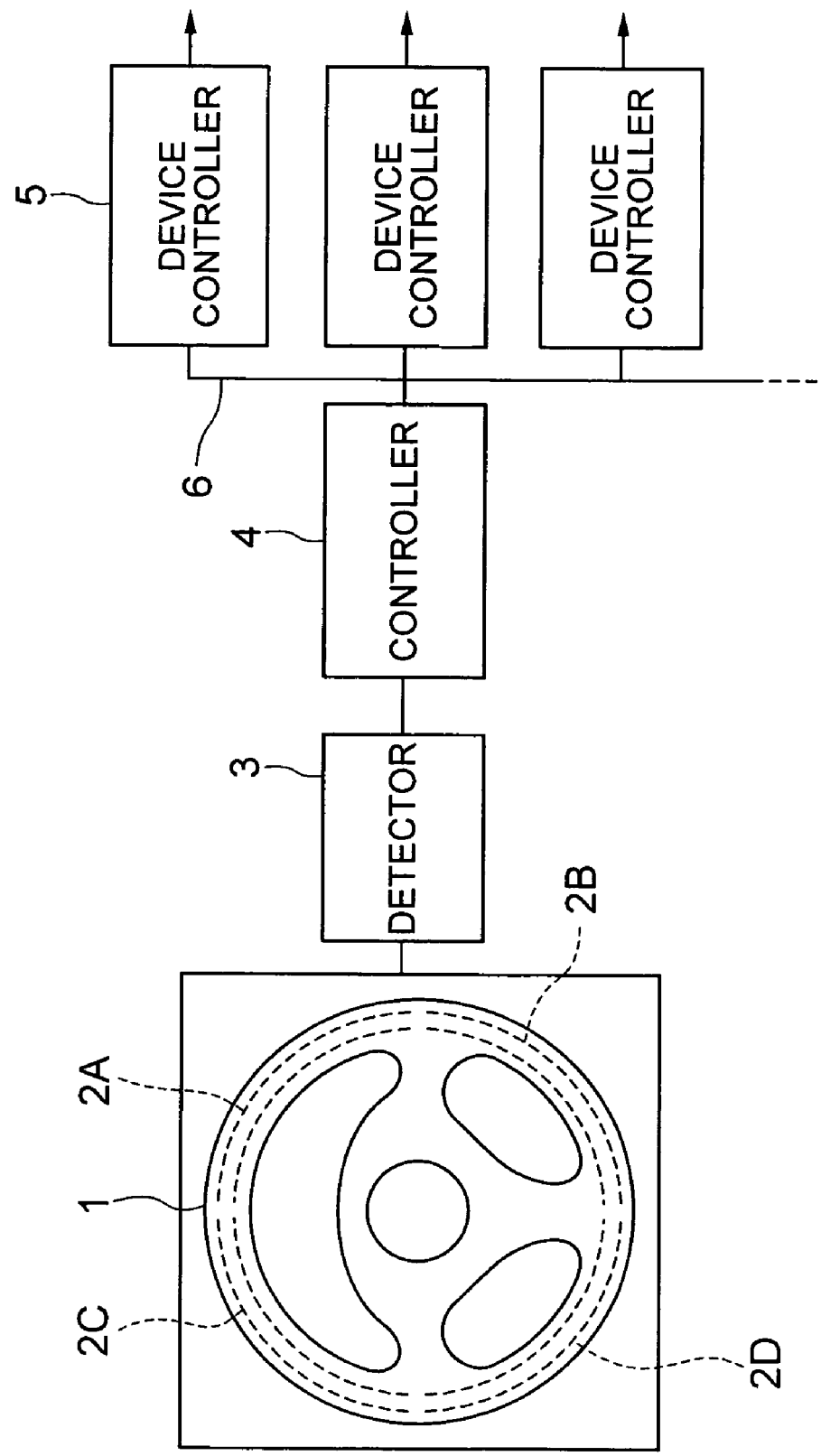
FIG. 1 is a general configuration diagram of a first embodiment of an operating device for on-vehicle equipment according to the present invention.
Figure 2:
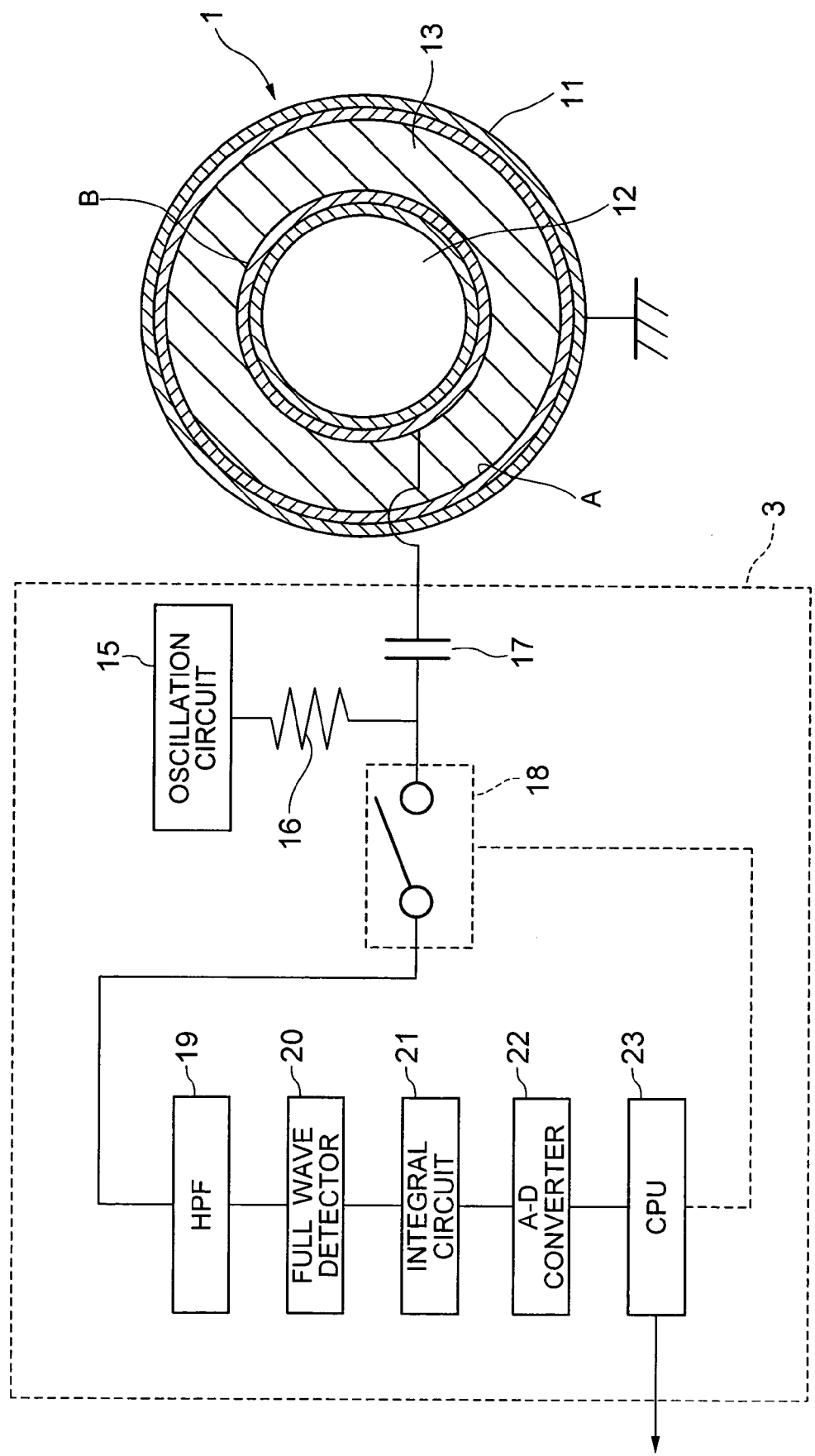
FIG. 2 is a configuration diagram of a force sensor and a detector in the first embodiment.

FIG. 1 is a general configuration diagram of a first embodiment of an operating device for on-vehicle equipment according to the present invention. FIG. 2 shows a configuration of a force sensor and a detector in the present embodiment. In the operating device for on-vehicle equipment in the present embodiment, a plurality of (in the illustrated example, four) force sensors 2 (2A to 2D) are buried in a grasping part of a steering wheel 1 used as a vehicle steering tool, as shown in FIG. 1. Outputs of respective force sensors 2 are input to a detector 3. The detector 3 detects force acted on the grasping part on the basis of the outputs of respective force sensors 2, and outputs the detected force to a controller 4. The controller 4 makes a decision whether the input detected signal is a signal for operating a plurality of (in the illustrated example, three) device controllers 5 for on-vehicle equipment. Based on the decision, the controller 4 outputs an operating signal to one of the device controllers 5 for on-vehicle equipment via a signal transmission path 6. At this time, the controller 4 discriminates a predetermined piece of the on-vehicle equipment associated with a detected signal of each force sensor 2, and outputs an operating signal to a device controller for the piece of the on-vehicle equipment.

In a circular section of the grasping part of the steering wheel 1 shown in FIG. 2, each force sensor 2 is formed by burying a pair of conductor foils A and B along a grasping face. In other words, a sectional structure of the steering wheel 1 includes an outer cylinder part 11, a core part 12, and a resin part 13 loaded between the outer cylinder part 11 and the core part 12. And the conductor foils A and B are stuck on the inside of the outer cylinder part 11 and outside of the core part 12, respectively. The conductor foil A on the outer cylinder part 11 side is grounded, and the conductor foil B on the core part 12 side is connected to the detector 3. It is sufficient that the resin in the resin part 13 has a characteristic that the resin can be barely transformed by grip force of the driver who grasps the steering wheel 1 or pressing pressure applied by a hand or a finger. A dielectric material other than resin, such as rubber, can be used as long as the dielectric material has such a characteristic. As for the conductor foils A and B, conductors such as copper foils can be used. However, a transparent material such as ITO (indium tin oxide) or NESA (tin dioxide) may be used, if the material has conductivity.

As shown in FIG. 2, the detector 3 includes an oscillation circuit 15 for applying a sine wave having a high frequency to the conductor foil B via a resistor 16 and a capacitor 17 for removing a DC component in a signal, and a multiplexer 18 connected to a node between the resistor 16 and the capacitor 17. The other end of the multiplexer 18 is connected to a circuit including a high pass filter 19 for passing only a signal having frequencies that are equal to or higher than a predetermined frequency, a full wave detection circuit 20 for conducting conversion of the signal to an absolute value and rectification, an integral circuit 21 for conducting gain adjustment and offset adjustment, an A-D converter 22 for converting an analog signal to a digital signal, and a CPU 23 for detecting force acted on the grasping part by conducting arithmetic operation on the basis of an output signal of the A-D converter 22. The CPU 23 selects a channel in the multiplexer 18, and changes over conductor foils B (Ba to Bd) associated with the respective force sensors (2A to 2D) one after another. Furthermore, the CPU 23 transmits a detected signal of force acted on the grasping part to the controller 4 shown in FIG. 1. By the way, the oscillation circuit 15 is connected to all conductor foils B via the resistor 16 and the capacitor 17. The capacitor 17 is not always necessary, but it may be removed.

Figure 3:
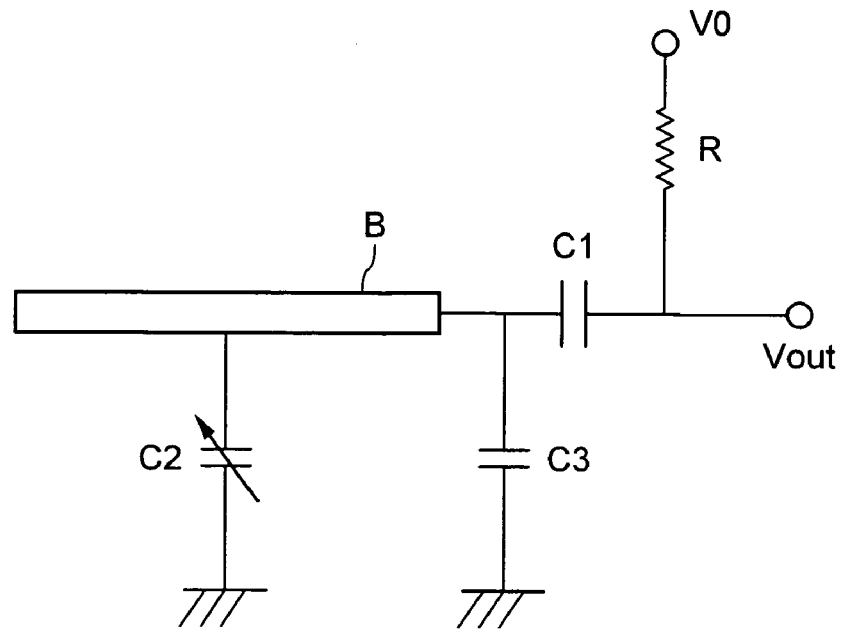
FIG. 3 is a circuit configuration diagram of the force sensor in the first embodiment.
Figure 4:
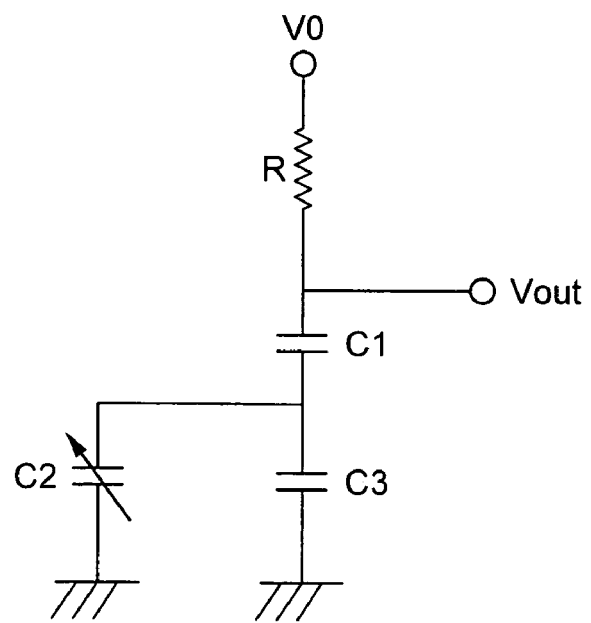
FIG. 4 is an equivalent circuit diagram of the force sensor in the first embodiment.

Operation in the first embodiment having such a configuration will now be described. Each force sensor 2 having the configuration shown in FIG. 2 can be represented by using an equivalent circuit shown in FIG. 3 or 4. In other words, the conductor foil B and the conductor foil A (grounded) constitute a capacitance C2 with the resin 13 therebetween. The conductor foil B is connected to the multiplexer 18 shown in FIG. 2 via a capacitance C1 of the capacitor 17. A sine wave AC voltage V0 output from the oscillation circuit 15 is applied to the conductor foil B via a resistance value R of the resistor 16 and the capacitance C1. A stray capacitance C3 is connected in parallel to the capacitance C2. An output voltage Vout of a detection circuit having such a configuration is input to the multiplexer 18 shown in FIG. 2.

Figure 5A:
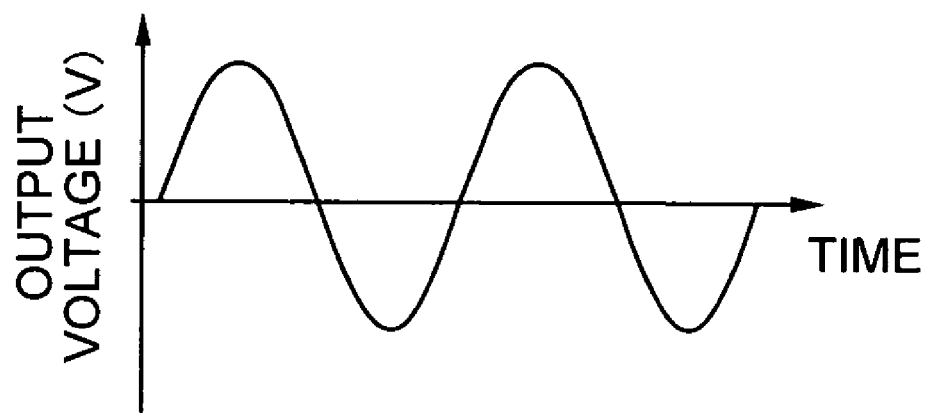
FIGS. 5A and 5B are diagrams showing a relation between grip force applied to the force sensor and an output voltage in the first embodiment.
Figure 5B:
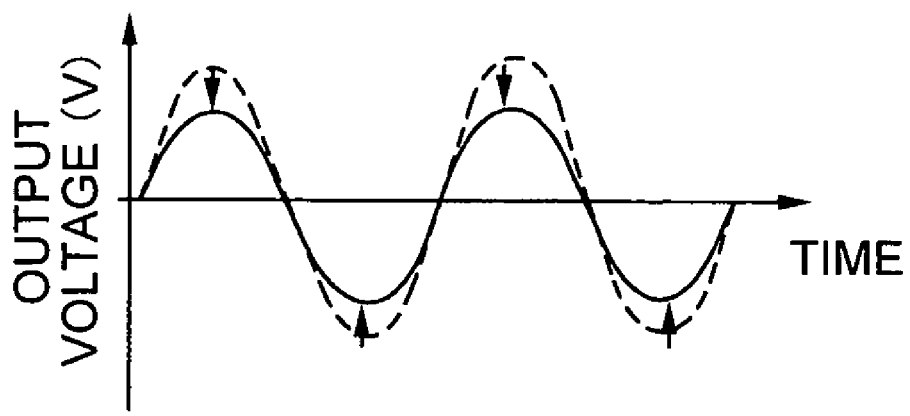

According to the force sensor 2 in the present embodiment, gripping the steering wheel 1 conducted by the driver transforms the resin 13 and changes a distance between the grounded conductor foil A and the conductor foil B. As a result, the capacitance C2 of the virtual capacitor formed between the conductor foil A and the conductor foil B changes, and the output voltage Vout changes as shown in FIGS. 5A and 5B. FIG. 5A shows a waveform of the output voltage Vout when the grip force or pressure is small, whereas FIG. 5B shows a waveform of the output voltage Vout when the grip force or pressure is large. When the grip force or pressure is large, amplitude of the output voltage becomes small as compared with the case where the grip force or pressure is small. Therefore, whether the grip force or pressure is large or small can be detected by measuring the output voltage Vout. If a pressure corresponding to the output voltage Vout is obtained by using calibration beforehand, the pressure can be calculated quantitatively.

Especially, in the present embodiment, a pair of conductor foils is buried along the grasping face of the steering wheel 1 to form the force sensors 2. Therefore, the detection sensitivity of steering force acted on the steering wheel 1, i.e., steering force in the circumference direction for rotating the steering wheel is low. On the other hand, the detection sensitivity of force in a direction different from that of the steering force, i.e., in a direction nearly perpendicular to the steering force can be made large. In other words, the force sensors 2 should be formed so as to detect force in a direction nearly perpendicular to a contact face of a hand or finger that grasps the steering wheel 1.

Operation of the detection circuit for detecting force acted on the grasping face of the steering wheel 1 on the basis of the output voltage Vout thus detected will now be described. First, the multiplexer 18 changes over detected signals of respective conductor foils B and inputs a detected signal to the high pass filter 19 so as not to prevent at least two conductor foils B from being connected to the high pass filter 19. As a result, one signal processing circuit including the high pass filter 19, the full wave detection circuit 20, the integral circuit 21 and the A-D converter 22 can process detected signals from a plurality of force sensors 2. Therefore, it is possible to reduce the number of components, the size and the cost. If the conductor foils B are installed at a considerable distance from the capacitor 17, it is desirable to use a shield line as a connection line between the conductor foils B and the capacitor 17 in order to prevent the influence of external noise.

Since the high pass filter 19 needs only to send Vout in the vicinity of the oscillation frequency of the oscillation circuit 15 to the full wave detection circuit 20, the high pass filter 19 removes noise having low frequencies. The full wave detection circuit 20 conducts absolute value conversion to convert a signal in the minus range to the plus range and rectifies Vout so as to make it possible to convert the Vout represented by a sine wave to a digital signal in the A-D converter 21. The integral circuit 21 conducts offset adjustment and gain adjustment on Vout output from the full wave detection circuit 20 to adjust the sensitivity in detecting whether a human body approaches and increase the detection sensitivity. The A-D converter 32 converts the analog signal Vout output from the integral circuit 21 to a digital signal, and outputs the digital signal to the CPU 23.

Figure 6:
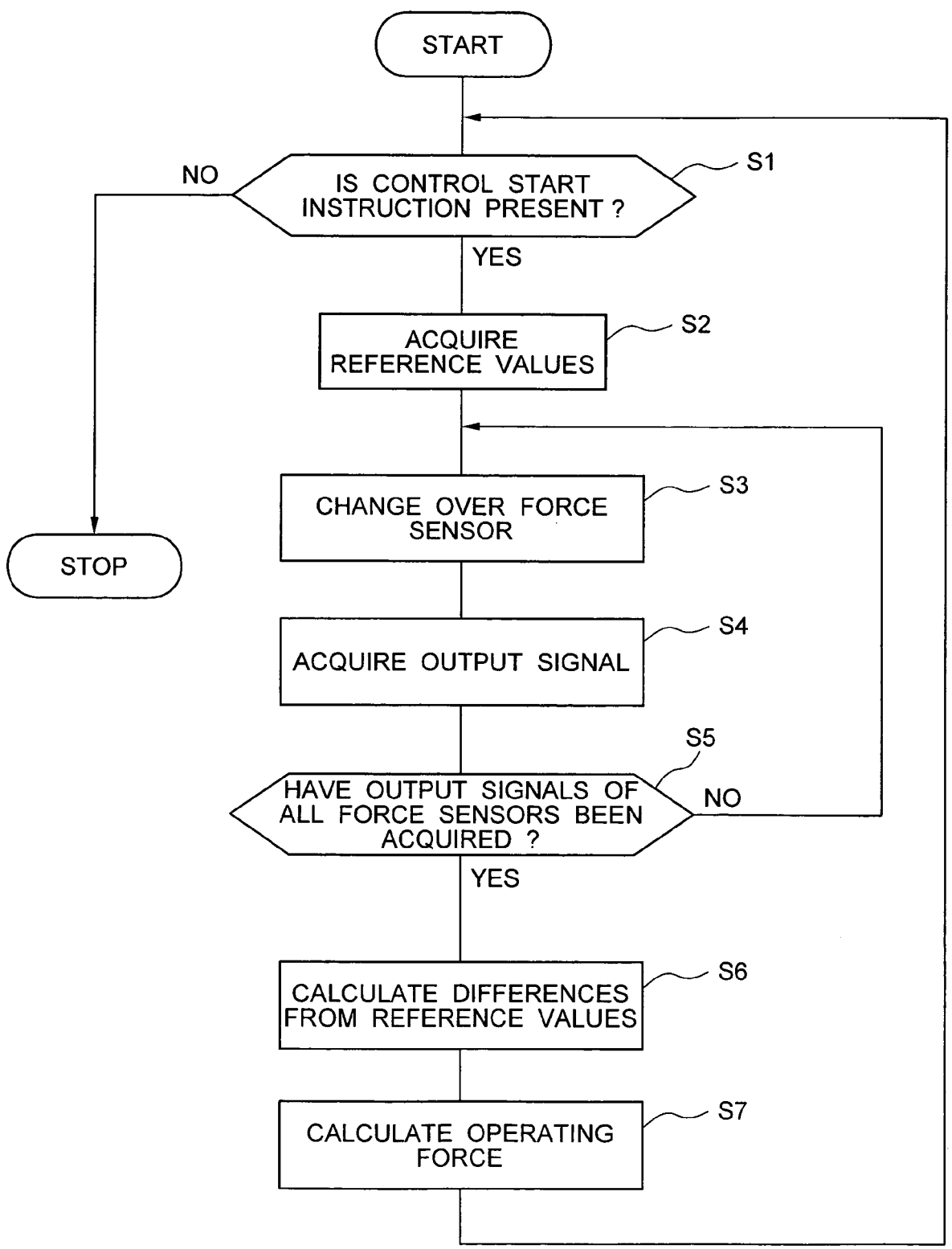
FIG. 6 is a flowchart showing an embodiment of a detected signal decision procedure in control in the first embodiment.

The CPU 23 calculates the grip force or pressure by conducting arithmetic operation on the basis of Vout supplied from the A-D converter 22. A detection algorithm of the grip force and pressure and a decision method for the detected signal in the controller 4 in the present embodiment will now be described with reference to a flowchart shown in FIG. 6. First, at step S1, the CPU 23 makes a decision whether a control start instruction for the operating device in the present embodiment is input. As this control start instruction, for example, a power supply on-signal for on-vehicle equipment turned on while the driver is operating an ordinary ignition key can be used. However, this is not restrictive, but a power supply on-signal for each piece of the on-vehicle equipment can be used. If the control start instruction is not present in the decision at step S1, control exercised by the CPU 23 is stopped. On the other hand, if the control start instruction is present, then the processing proceeds to step S2 and initial processing of acquiring output signals of the conductor foils Ba to Bd associated with all force sensors 2A to 2D as reference values is conducted. Here, the reference values are so-called background values in a situation where grip force or pressure which is operating force is not acted on the force sensors 2A to 2D.

Subsequently, at step S3, the CPU 23 controls the multiplexer 18 and selects one from a plurality of conductor foils B. At step S4, the CPU 23 takes in an output signal of the selected conductor foil B from the A-D converter 22. Subsequently, at step S5, the CPU 23 makes a decision whether the output signals of the conductor foils B (Ba to Bd) of all force sensors 2 (2A to 2D) have been acquired. If it is judged in this decision that the acquisition of the output signals of all conductor foils is not completed, then the CPU 23 returns to step S3 and steps S4 and S5 are repeated. If it is judged in the decision at step S5 that the acquisition of the output signals of all conductor foils is completed, then the CPU 23 proceeds to step S6 and finds difference values between output signals of respective conductor foils B acquired at step S5 and reference values of respective conductor foils B acquired at the step S2. FIG. 7 shows an example of reference values, output signals and difference values of the conductor foils Ba to Bd respectively of the force sensors 2A to 2D.

Subsequently, at step S7, the CPU 23 calculates the grip force or pressure. The CPU 23 looks for a force sensor 2 for which the difference value of the conductor foil B is at least a predetermined threshold value. If the driver strengthens grip force of a grasping part corresponding to any force sensor 2, then the difference value of the corresponding force sensor 2 becomes at least the predetermined threshold value. For example, if the threshold value is 2.0 in the example shown in FIG. 7, then a force sensor 2 that is at least 2.0 in difference value is the force sensor 2C. As a result, it can be detected that the force sensor 2C disposed on the upper-left side of the steering wheel 1 shown in FIG. 2 has been pressed. The output signal of the force sensor 2C is transmitted to the controller 4, and operation such as driving various on-vehicle devices and processing is executed.

After the calculation processing at step S7, the CPU returns to step S1. Until a control end instruction is given, the CPU 23 repeats the processing in the range of step S3 to step S7, and detects whether the respective force sensors 2 have been operated. As a result, it is possible to change over the conductor foils B of the force sensors 2 one after another, identify a force sensor 2 associated with a conductor foil B that has changed in output signal, and detect whether input operation associated with the force sensor 2 has been conducted.

Figure 8:
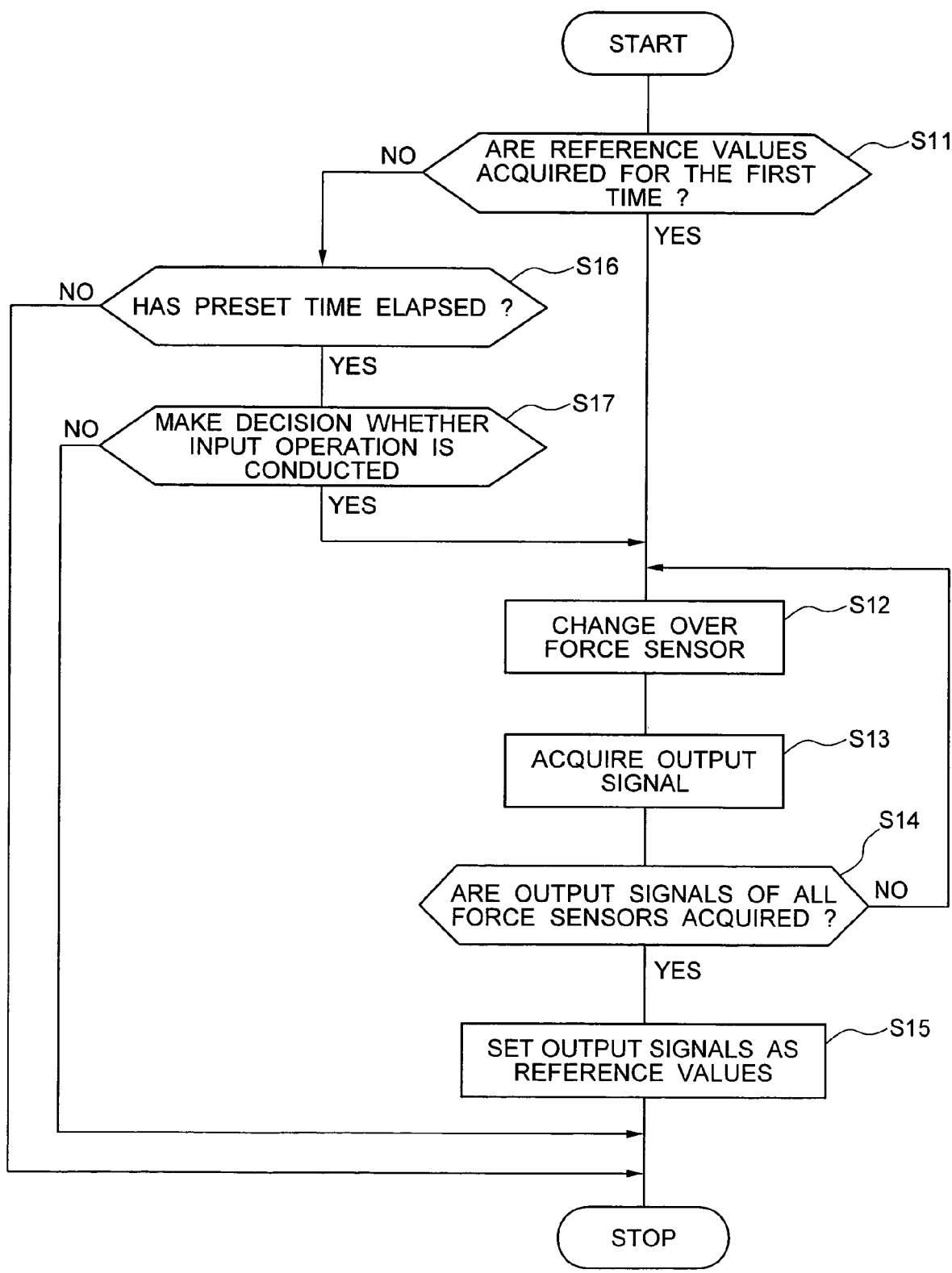
FIG. 8 is a flowchart showing an example of a reference value acquisition method in the force sensors in the first embodiment.

An example of the method for reference value acquisition conducted at step S2 shown in FIG. 7 will now be described with reference to a flowchart shown in FIG. 8. First, at step S11, it is determined whether processing is processing for acquiring the reference values for the first time after the start of control. In the case where the reference values are acquired for the first time, changeover to one conductor foil B is conducted at step S12. At step S13, the CPU 23 receives the output signal of the selected conductor foil B. Subsequently, at step S14, it is determined whether the output signals of all conductor foils B have been acquired. If acquisition of the output signals of all conductor foils B is not completed, then the processing returns to step S12, changeover to the next conductor foil B is conducted, and acquisition of an output signal is continued. If it is judged at step S14 that acquisition of the output signals of all conductor foils B is completed, then the output signals of all force sensors 2 acquired at step S13 are set as the reference values of respective force sensors 2 at step S15.

On the other hand, if it is judged at step S11 that the processing for acquiring the reference values is not conducted for the first time, then the CPU 23 proceeds to step S16 and makes a decision whether a predetermined time has elapsed since the acquisition of the reference values conducted last time. If it is judged in this decision that the predetermined time has elapsed since the acquisition of the reference values conducted last time, then the CPU 23 proceeds to step S17 and makes a decision whether input operation has been conducted for a force sensor 2. If it is judged in the decision at step S16 that the predetermined time has not elapsed, then the CPU 23 does not update the reference values, and finishes the reference value acquisition processing without updating the reference values. If it is judged at step S17 that input operation for the force sensor 2 is not conducted, then processing in the range of step S12 to step S15 is conducted to update the reference values. If the input operation is judged in the decision at step S17 to have been conducted, then the reference value acquisition processing is finished.

The decision conducted at step S17 as to whether the input operation has been conducted is made on the basis of difference values between the reference values and the output signals of all force sensors 2. If all difference values are less than a predetermined value, then it is judged that input operation has not been conducted. Even if one difference value becomes at least the predetermined value, input operation is judged to have been conducted and the reference values are not updated. This is because updating the reference values while input operation is being conducted prevents subsequent detection of input operating signals from being conducted accurately.

In principle, the reference values are acquired immediately after the control start. When a predetermined setting time has elapsed and input operation is not being conducted, reference values are acquired again and updated. Even if an output signal is changed by time elapse or an environment change, therefore, an operating signal can be detected precisely. If it is known that the output signal of each force sensor 2 is changed little by time elapse or an environment change, however, the reference values may be acquired immediately after the control start only once, without updating them.

According to the first embodiment, it is possible to operate the force sensors 2 and operate the on-vehicle equipment by adjusting grasping force of the steering wheel 1 or pressing the grasping part of the steering wheel 1 without letting go his or her hold of the steering wheel 1, as heretofore described. As a result, the driver can operate the on-vehicle equipment without turning his or her eyes away from the front and letting go his or her hold of the steering wheel 1. Therefore, the safety can be assured.

Furthermore, since a plurality of force sensors 2 are provided, arbitrary pieces of the on-vehicle equipment such as the brake, accelerator, power window, audio device, car navigation, on-vehicle communication system and information terminal can be operated. In addition, the operating device for on-vehicle equipment corresponding to selection of a piece of the on-vehicle equipment or selection of an operating function of the on-vehicle equipment can be constructed according to operating patterns such as operating sequences of a plurality of force sensors 2 and the number of times of operating the same force sensor 2, as in an embodiment described later.

In particular, the force sensors 2 in the first embodiment are formed by burying a pair of conductor foils A and B with the resin 13 serving as the dielectric layer between, along the grasping face of the steering wheel 1. And force acted on the grasping part of the steering wheel 1 is detected on the basis of the capacitance between the pair of the conductor foils A and B. Therefore, force in a direction different from the steering force can be detected from among forces of hands and fingers acted on the steering wheel 1. In other words, the force sensors 2 are formed to detect force in a direction nearly perpendicular to the contact face of the hands or fingers grasping the steering wheel 1. Therefore, an operating signal for on-vehicle equipment can be detected in distinction from the steering force.

Furthermore, background values acting on the force sensors 2 are set as the reference values in measurement. Therefore, it can be avoided to falsely detect an output signal of a force sensor 2 caused by ordinary grip force when the driver touches the steering wheel 1 lightly, as an operating signal.

In the first embodiment, an example in which the steering wheel 1 is used as a steering tool has been described. However, the present invention is not limited to this, but it can be applied to a steering tool such as a steering lever or a steering stick.

Second Embodiment

Figure 9:
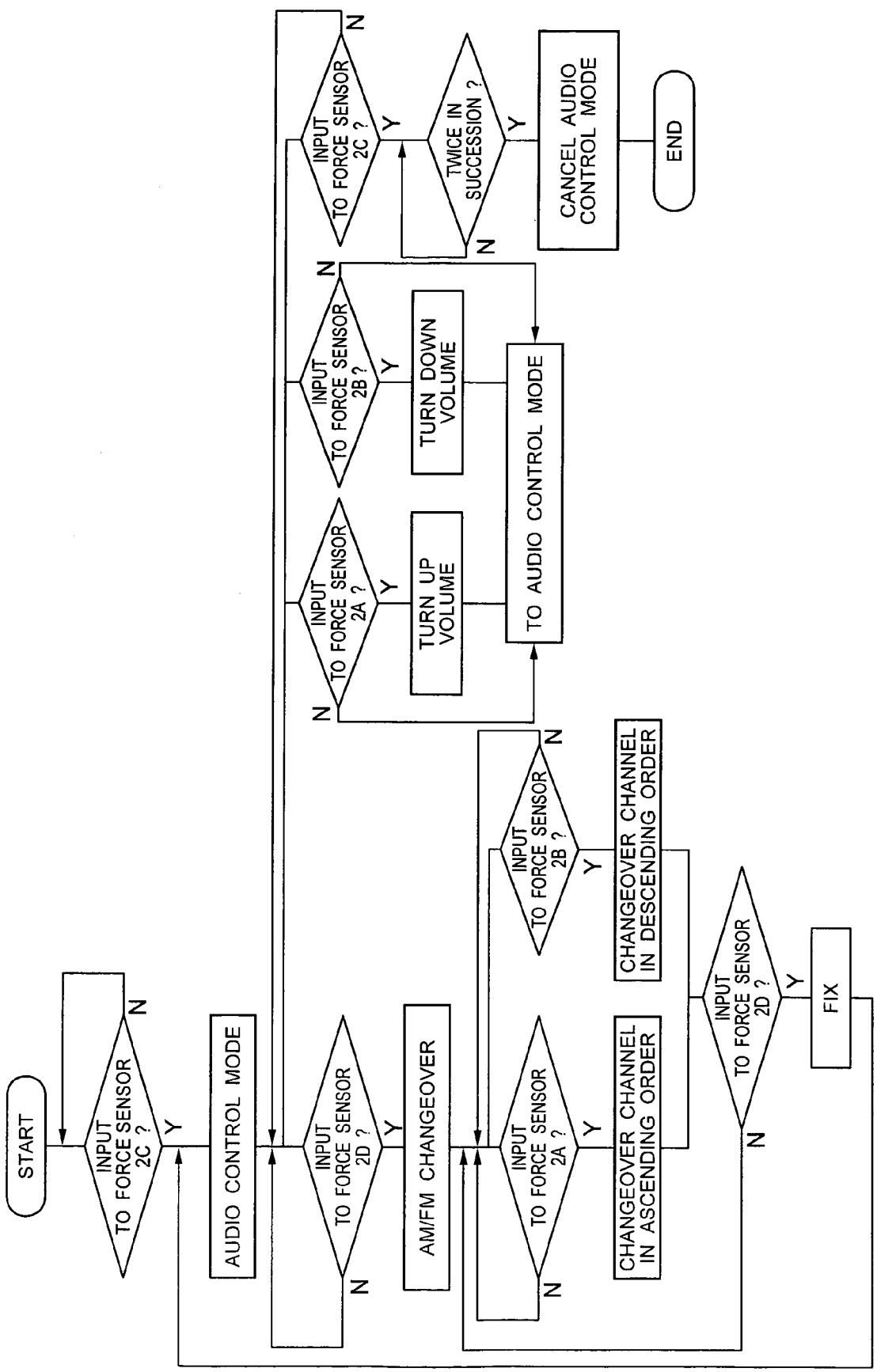
FIG. 9 is an operation block diagram of a second embodiment obtained by applying an operating device for on-vehicle equipment according to the present invention to channel selection and volume control of an audio device.

FIG. 9 shows an operation block diagram of a second embodiment obtained by applying the operating device in the first embodiment to channel selection and volume control of an audio device installed on an automobile. In the present second embodiment, functions associated with operations of the audio device are set for the force sensors 2A to 2D shown in FIG. 1. In other words, if the driver grasps a steering wheel part associated with the force sensor 2C located on the left-top side of the steering wheel shown in FIG. 1 only once, then operation of the force sensor 2C is detected by the detector 3 shown in FIG. 1. It is judged by the controller 4 to be a specific operating signal for a preset audio device. In the present second embodiment, it is judged to be a control mode for the audio device. After it is judged to be the control mode, the force sensor 2A and the force sensor 2B located on the right hand side of the steering wheel 1 shown in FIG. 1 are recognized as operating switches for volume control. The force sensor 2D located on the left bottom side of the steering wheel 1 is recognized as an operating switch for channel selection. Furthermore, the force sensor 2C is recognized as an operating switch for canceling the control mode.

Each time the driver strongly grasps the grasping part of the steering wheel 1 associated with the force sensor 2D, the detector 3 and the controller 4 recognize that an operating signal has been input, and change over the audio channel selection mode between AM broadcast and FM broadcast. If the driver sets the selection mode to the AM broadcast, then the driver selects a channel in the AM broadcast by using the force sensor 2A and the force sensor 2B. In the present second embodiment, the force sensor 2A is set so as to be able to change the channel in the ascending order, and the force sensor 2B is set so as to be able to change the channel in the descending order. Even if the driver goes beyond a desired channel when selecting a channel in the ascending order, the driver can select a channel rapidly by operating the force sensor 2B to select the channel in the descending order. Thereafter, the driver fixes the selected channel by strongly grasping the steering wheel part associated with the force sensor 2D so as to prevent contact between a hand or another body region and the steering wheel 1 from causing an unintended channel change. And return to the audio control mode is conducted.

On the other hand, if a region associated with the force sensor 2A or the force sensor 2B is operated in the state of the audio control mode, then the controller judges that a volume control input order is given and conducts operation to turn up the volume whenever an operating signal from the force sensor 2A is detected. On the other hand, if an operating signal from the force sensor 2B is detected, the controller conducts operation to turn down the volume.

When canceling the audio control mode, the driver strongly grasps the region associated with the force sensor 2C twice, and the controller 4 exercises control so as to cancel the control mode for operating the audio device. In the present first embodiment, the audio control mode is automatically canceled if an operating signal from the force sensor 2 is not detected within a preset time period.

Third Embodiment

Figure 10:
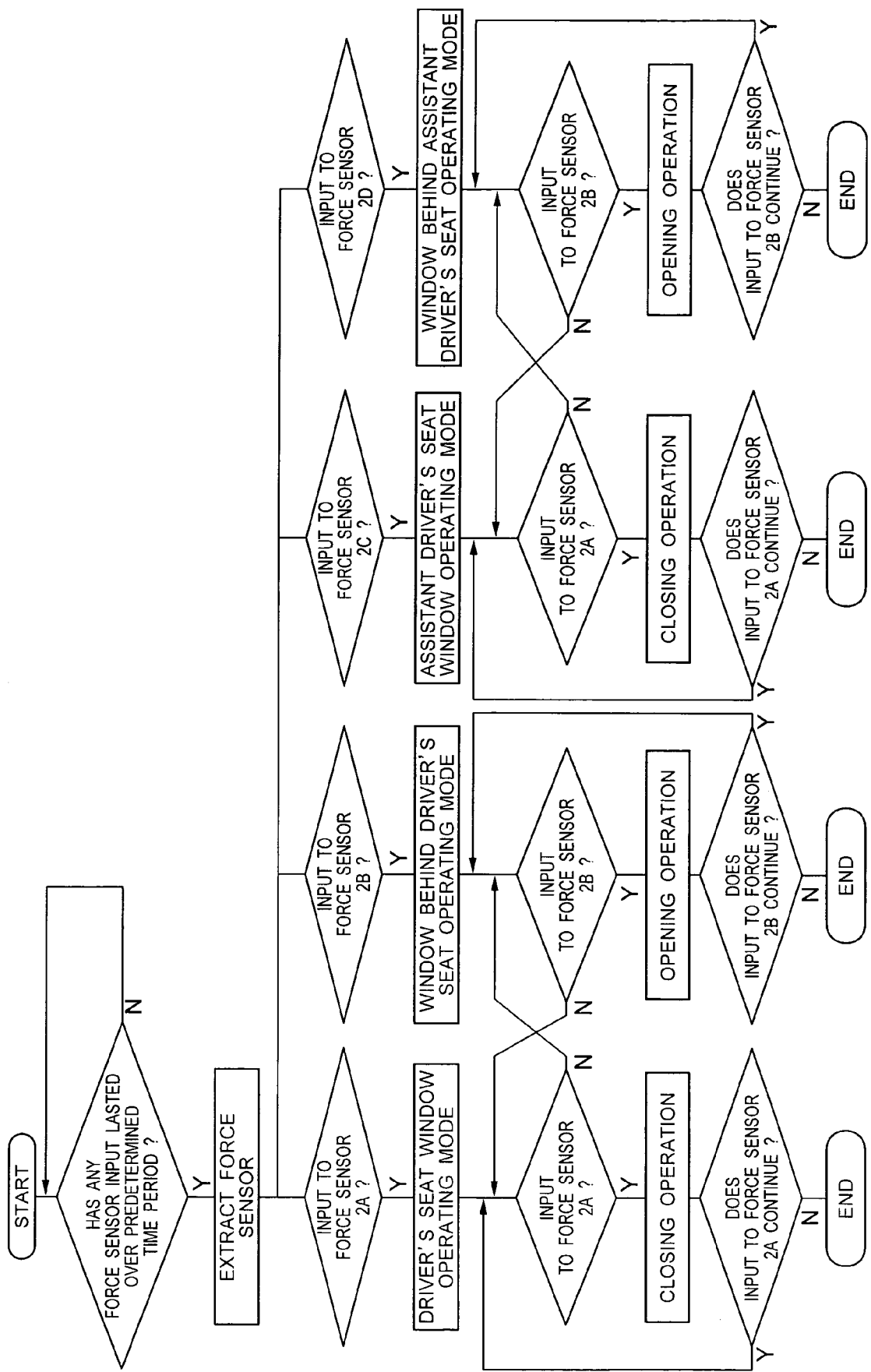
FIG. 10 is an operation block diagram of a third embodiment obtained by applying an operating device for on-Vehicle equipment according to the present invention to power window opening and closing operation.

FIG. 10 shows an operation block diagram of a third embodiment obtained by applying the operating device in the first embodiment to power window opening and closing operation on an automobile. In the present third embodiment, functions associated with operations of the power window are set for the force sensors 2A to 2D shown in FIG. 1. In other words, the driver strongly grasps a region associated with the force sensor 2A or the force sensor 2B located on the right-hand side of the steering wheel 1 shown in FIG. 1 or a region associated with the force sensor 2C or the force sensor 2D located on the left-hand side of the steering wheel 1 for at least a preset time period. As a result, the controller 4 recognizes it as a power window operation. And changeover to a power window control mode preset so as to be associated with a force sensor 2 to which an operating signal has been input is conducted. For example, if a first operation is conducted by using the force sensor 2A, the controller 4 recognizes it as a power window control mode for a driver's seat (in a case of a car with a right-hand steering wheel). In the same way, the controller 4 recognizes an input to the force sensor 2B as a power window control mode for a seat behind the driver's seat. The controller 4 recognizes an input to the force sensor 2C as a power window control mode for an assistant driver's seat. The controller 4 recognizes an input to the force sensor 2D as a power window control mode for a seat behind the assistant driver's seat.

After the driver conducts setting operation for a power window to be operated, the steering wheel 1 is released from the grip force or pressure. Thereafter, the force sensor 2A serves as an operating switch for window closing operation and the force sensor 2B serves as an operating switch for window opening operation, in the two latter-cited power window control modes. In other words, while the driver is strongly grasping the force sensor 2A, the window rises and closing operation is conducted. While the driver is strongly grasping the force sensor 2B, the window falls and opening operation is conducted.

Fourth Embodiment

In the second and third embodiments, the case where the first embodiment is applied to the operation of the audio device and the case where the first embodiment is applied to the operation of the power window have been described. If both operating processing in the second embodiment and operating processing in the third embodiment are set in the controller 4, however, a single operating device can be used properly as operating devices for the two pieces of the on-vehicle equipment.

In other words, the audio device can be operated from the steering wheel 1. In addition, an operating input to the top side part of the steering wheel 1 causes selection of a channel in the ascending order, volume turn-up, or window closing. An operating input to the bottom side part of the steering wheel 1 causes selection of a channel in the descending order, volume turn-down, or window opening. Since the top and bottom or left and right arrangement of the force sensors 2 are thus related sensuously to contents of operating the audio device, the driver who is driving the automobile can understand easily. Therefore, safety in driving is not hampered, and accidents caused while operating the audio device can be reduced.

Furthermore, voice guidance can be combined with operating the on-vehicle equipment conducted by using the steering wheel 1. As a result, the driver can understand the input operation more easily and an operating device that can be operated easily can be implemented.

Fifth Embodiment

The force sensors 2 in the first to fourth embodiments have a structure in which the steering force detection sensitivity of the steering wheel 1 is low. For further enhancing the safety, however, it is desirable to make operating using the force sensors 2 possible only when the driver is not conducting steering using the steering wheel 1, i.e., when the driver is not conducting turning operation on the automobile.

Figure 11:
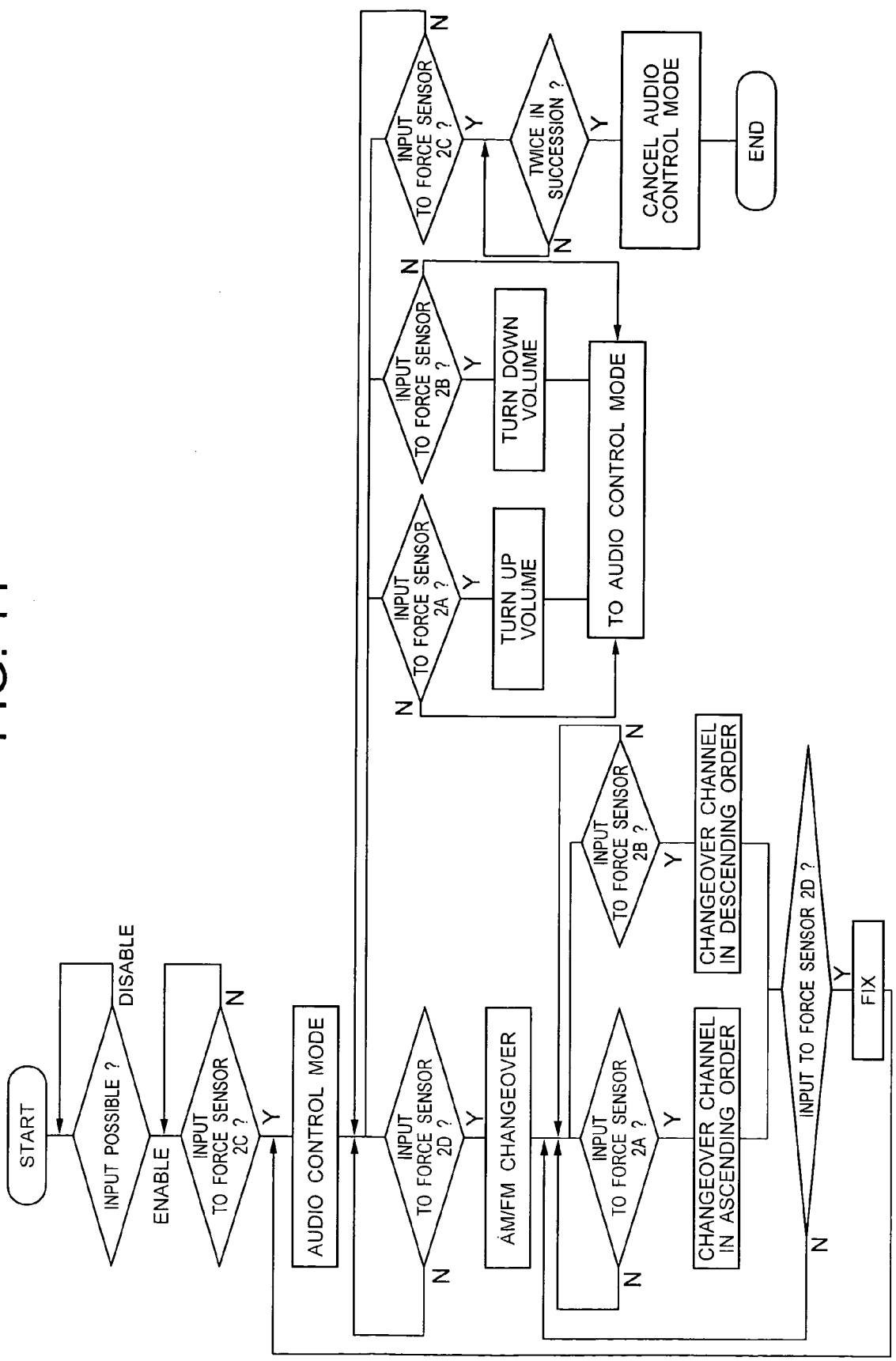
FIG. 11 is an operation block diagram of a fifth embodiment including an input enable/disable decision unit for making an output signal of a force sensor effective when rotation operation of a steering wheel is not conducted.

In other words, it can be implemented by, for example, providing a rotation detector, such as an encoder, for detecting the rotation of the steering wheel 1 and providing an input enable/disable decision unit for making output signals of the force sensors 2 effective when the rotation of the steering wheel 1 is not detected or when the rotation of the steering wheel 1 is in a range of the preset rotation angle. In this case, it can be implemented by, for example, providing the input enable/disable decision unit shown in FIG. 11 immediately after the start block in FIG. 9 or FIG. 10.

Sixth Embodiment

In the fourth embodiment, the case where operating both the audio device and the power window is implemented by the operating gist and operating procedure of the four force sensors 2 provided on the steering wheel 1 has been described. In general, however, it is conceivable to implement an operating device that can be operated easily by the driver by providing an individual switch or operating part for each piece of the on-vehicle equipment. Force sensors 2 in a sixth embodiment suitable for such a case will now be described with reference to FIG. 12.

Figure 12:
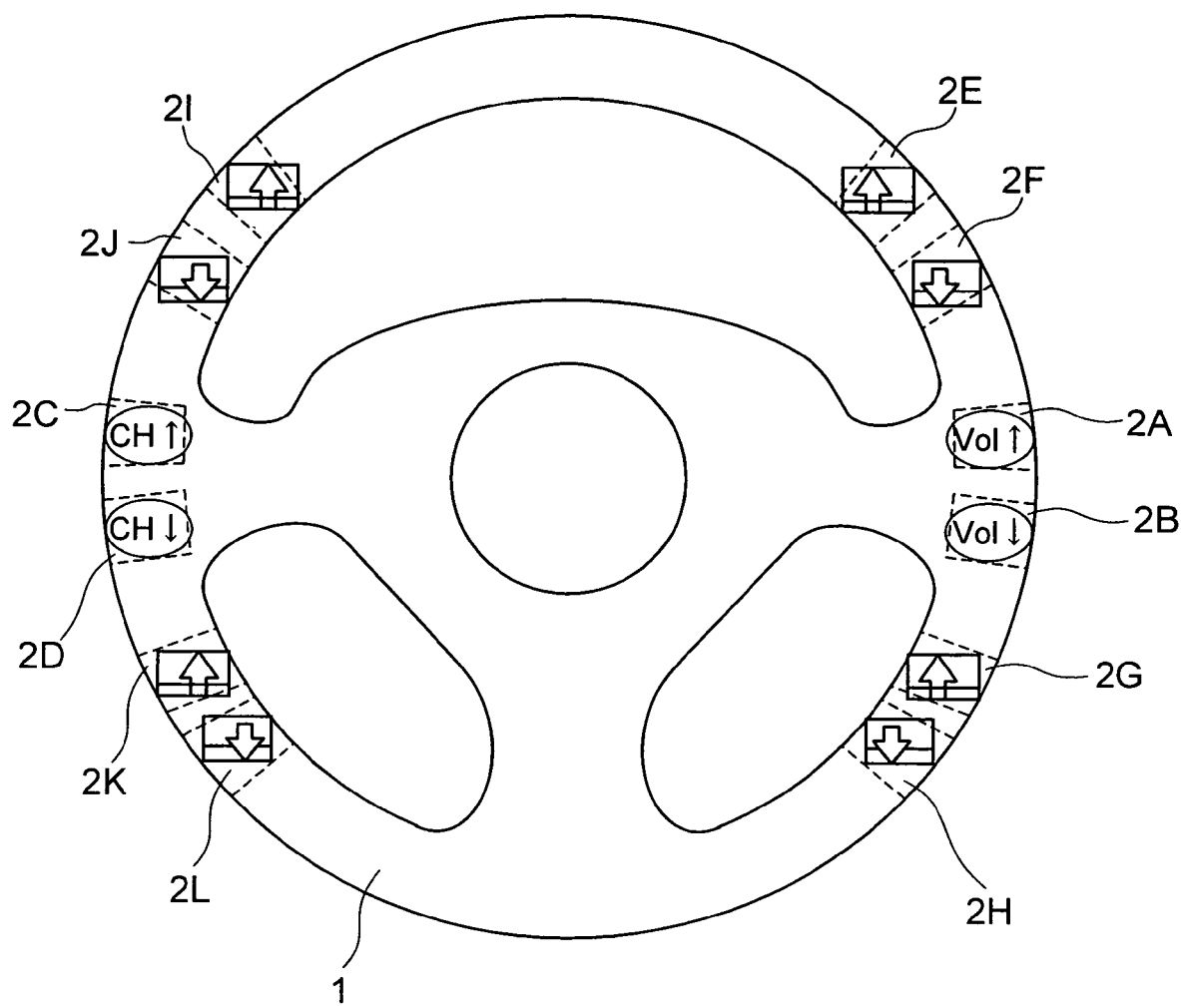
FIG. 12 is a configuration diagram of a steering wheel in a sixth embodiment incorporating force sensors to conduct audio device operation and power window operation individually.

In the present sixth embodiment, the steering wheel 1 incorporates a total of twelve force sensors 2A to 2L for operating the audio device and operating the power window, as shown in FIG. 12. In the present embodiment, force sensors 2A and 2B are assigned to operating the audio volume. Force sensors 2C and 2D are assigned to selecting the audio channel. Force sensors 2E and 2F are assigned to operating the driver's seat window to open or close it. Force sensors 2G and 2H are assigned to operating the window behind the driver's seat to open or close it. Force sensors 2I and 2J are assigned to operating the assistant driver's seat window to open or close it. And force sensors 2K and 2L are assigned to operating the window behind the assistant driver's seat to open or close it. Each of the force sensors 2A to 2L has a structure configured in the same way as that shown in FIG. 2.

Furthermore, a mark which indicates an operation subject and operation contents is exhibited on a surface of a region of the steering wheel 1 in which each of the force sensors 2A to 2L is buried. As a result, the driver can recognize the operation subject and operation contents easily. The detector 3 and the controller 4 are absolutely the same as those described with reference to the first embodiment.

In the present sixth embodiment, each of the force sensors 2A to 2L is associated with operating one of pieces of the on-vehicle equipment. For example, if the driver operates a steering wheel part associated with the sensor 2A by strongly grasping or pressing the part, the controller 4 exercises control to turn up the audio volume on the basis of the operating signal.

In the present embodiment as well, the force sensors are disposed so as to be associated with operation contents of the devices to be operated. For example, the opening and closing operation of the driver's seat window is disposed on the top part on the right-hand side of the steering wheel. As a result, it is also possible for the driver who is driving the automobile to understand the operation easily in the same way as the first embodiment. In the present embodiment as well, it is possible to implement a system in which operation is made possible only when the driver is not conducting the turning operation of the automobile by using the steering wheel, in order to further enhance the safety.

Seventh Embodiment

Figure 13:
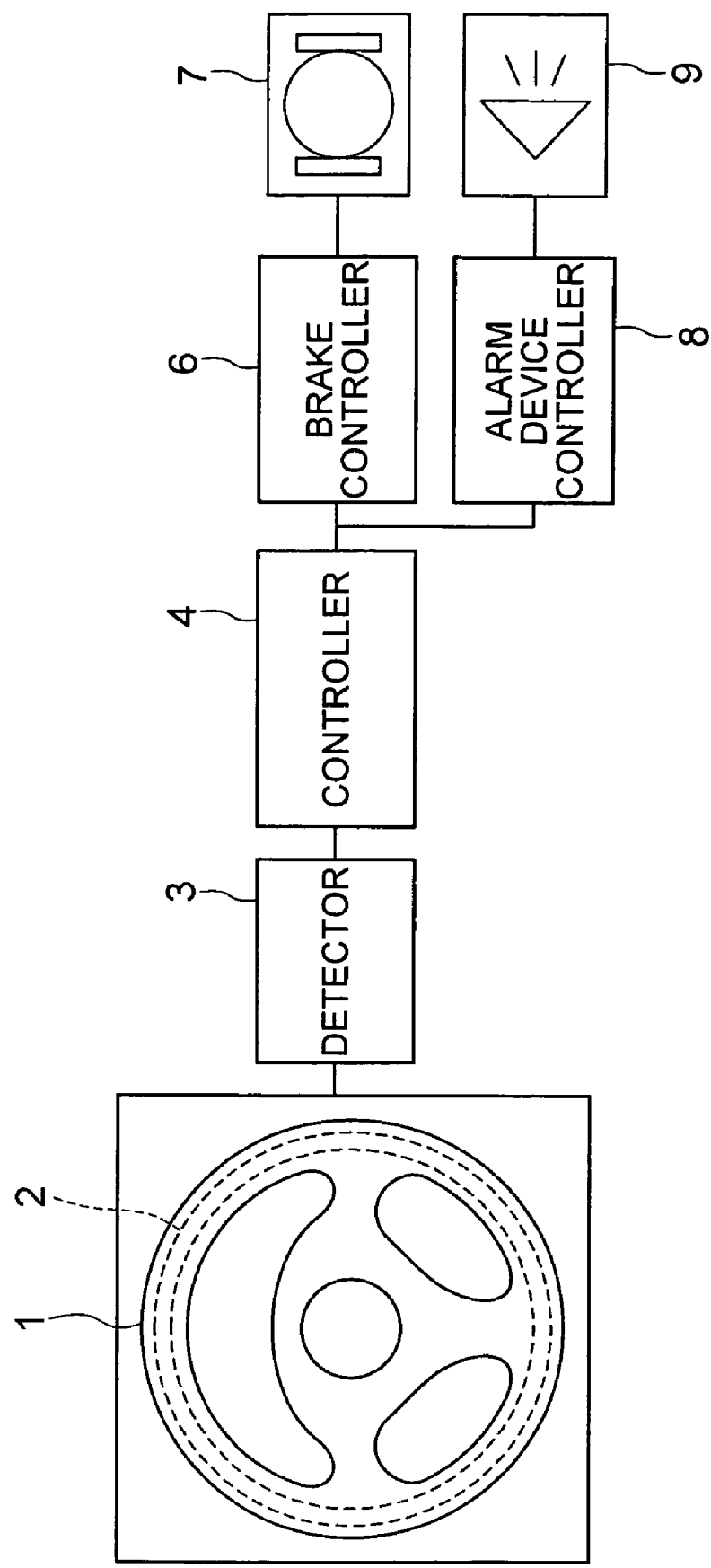
FIG. 13 is a general configuration diagram in a seventh embodiment in which an operating device for on-vehicle equipment according to the present invention is applied to a brake.
Figure 14:
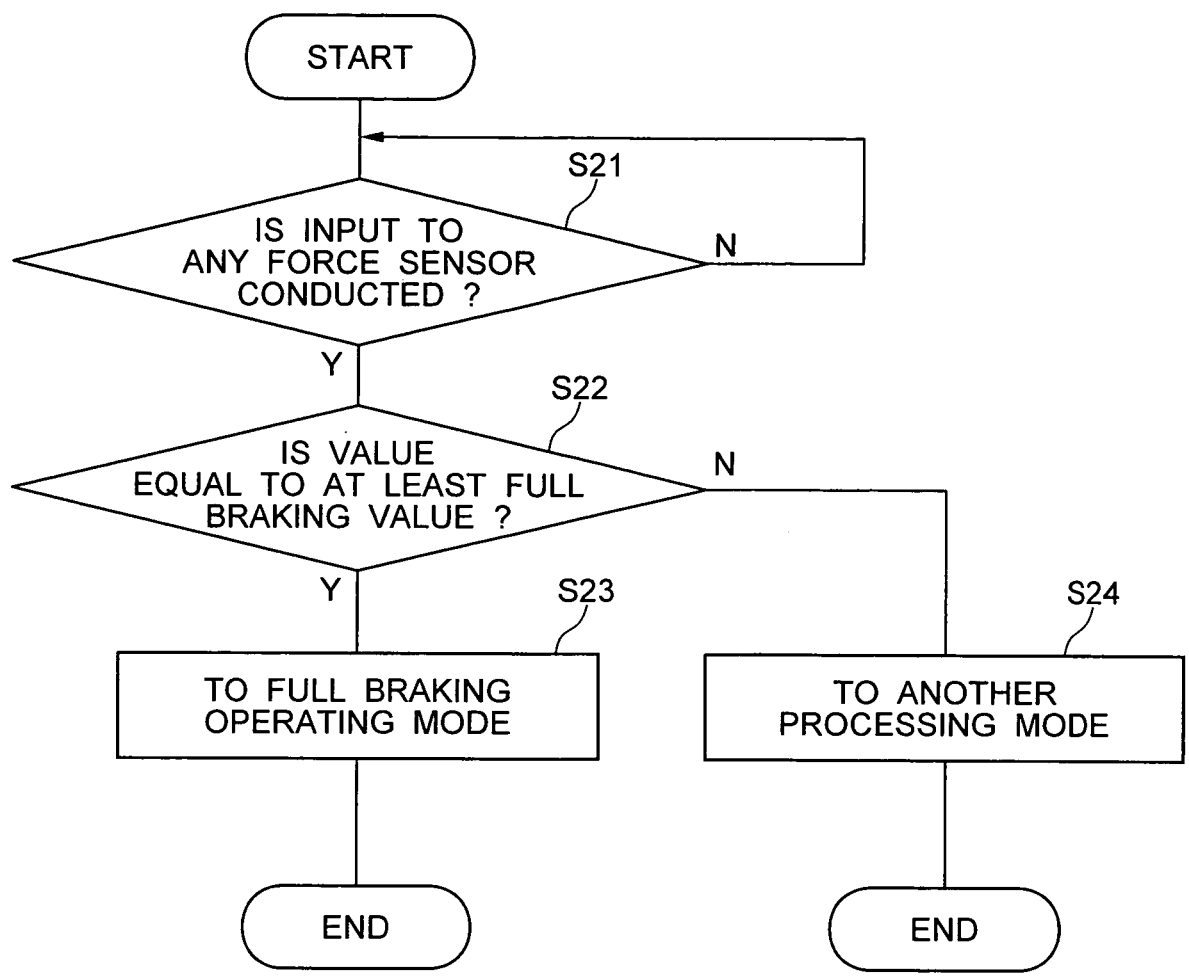
FIG. 14 is a flowchart showing a control procedure in the seventh embodiment.

FIG. 13 shows a general configuration diagram of a seventh embodiment of an operating device for on-vehicle equipment according to the present invention. The seventh embodiment differs from the first embodiment in that the operating device for on-vehicle equipment according to the present invention is applied to a braking device of automobiles. Parts having the same function and configuration are denoted by like reference characters and description of them will be omitted.

In the present embodiment, an embodiment of braking operation of an automobile using the above-described operating device will now be described. If operating force associated with the output voltage Vout of the force sensors 2 is found previously by calibration, it is possible to quantitatively find a pressure applied to the force sensors 2 as described with reference to the first embodiment.

On the other hand, when applying full braking during driving, the brake is not activated until the foot releases the accelerator pedal and then depresses the brake pedal, resulting in the so-called idle running distance. As a result, it is made difficult to shorten the distance required for the automobile to actually stop. By the way, it is conceivable that the driver strongly grasps the steering wheel when applying full braking. Therefore, it is proposed in JP-A-09-058426 to execute the full braking operation by using brake operating switches provided in the steering wheel. However, the brake operating switches described in JP-A-09-058426 are provided on the inner circumference face in left and right symmetrical positions of the steering wheel. Therefore, the driver needs to always grasp the regions of the brake operating switches, resulting in inconvenience in use.

Therefore, the present embodiment has a feature that all of the four force sensors 2A to 2D provided nearly over the whole circumference of the steering wheel 1 are used as braking operating sensors. If the controller 4 judges that operation of full braking has been conducted, on the basis of output signals of the force sensors 2A to 2D as shown in FIG. 12, then the controller 4 sends an operating signal to a brake controller 6 to activate a brake 7.

Operation conducted by the controller 4 at this time will now be described with reference to a flowchart shown in FIG.

14. If a detection signal from at least one force sensor 2 is input from the detector 3 to the controller 4 (S21), then the controller 4 determines whether the input detection signal exhibits a value which is at least a predetermined pressure and the state continues over at least a predetermined time period. If the result is affirmative, then the controller 4 judges the operation as full braking operation (S22). If the controller 4 judges the operation to be full braking operation, then the controller 4 sends an operating signal to the brake controller 6 to activate the brake 7 (S23). If the controller 4 judges the operation not to be full braking operation, then the controller 4 judges the operation to be another operation for the on-vehicle equipment described with reference to the second embodiment or the like, and conducts associated operation processing (S24).

Figure 15:
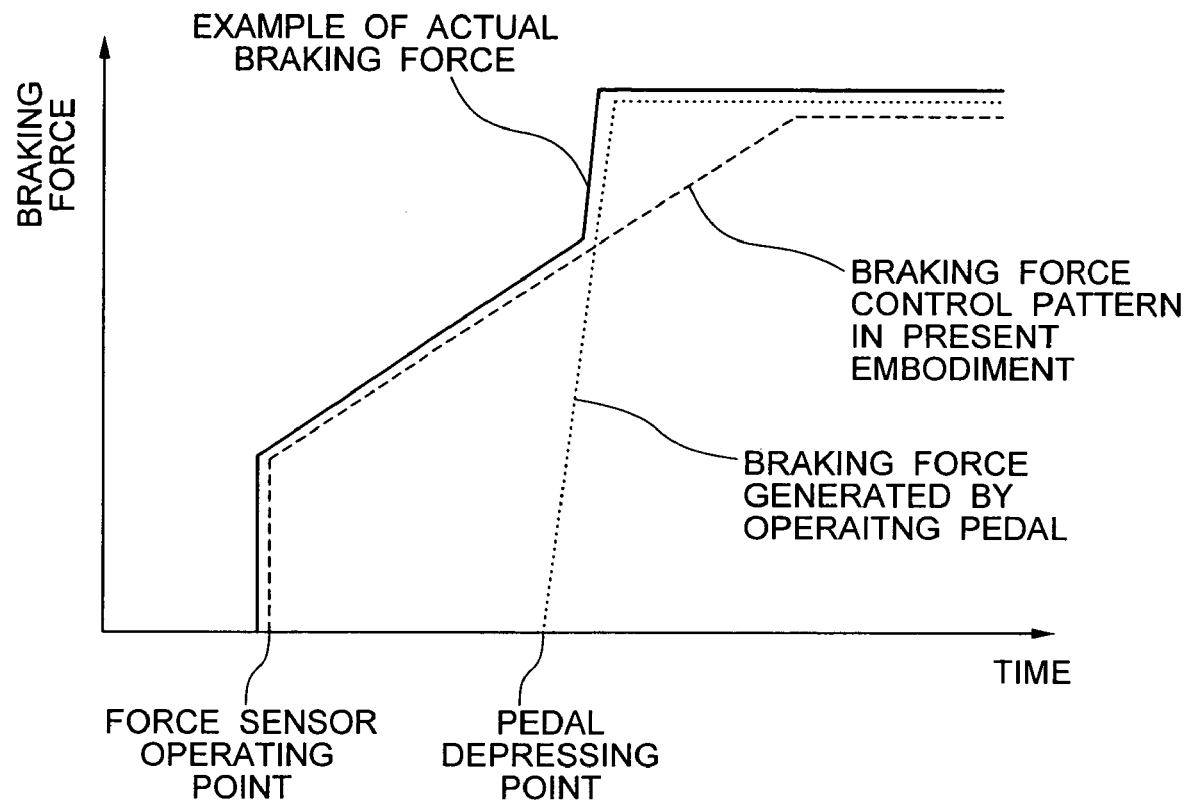
FIG. 15 is a diagram showing an example of a method for controlling braking force in brake control in the seventh embodiment.

FIG. 15 shows an example of a control method of braking force in the brake controller 6. If a brake operating signal is input from the controller 4, then the brake controller 6 does not apply maximum braking force to the brake 7, but exercises control so as to increase braking force gradually from predetermined braking force to reach maximum braking force as represented by a dash line. By the way, if braking force generated by brake operation of the driver using the brake pedal represented by a dotted line is applied to the brake 7, then a command of greater braking force takes preference for the brake 7. As a result, braking that conforms to the driver's intention can be applied as represented by a solid line. In FIG. 15, the dash line, the dotted line and the solid line that represent braking force are shown to be separated from each other in a portion they draw near in order to make a distinction clearly. As a matter of fact, however, the dash line, the dotted line and the solid line overlap each other.

According to the present embodiment, braking force is acted by operating the force sensor 2 before the driver moves a foot from the accelerator pedal to the brake pedal. As a result, the idle running distance can be shortened, and the overall stopping distance can be shortened.

By the way, instead of the control of the control force shown in FIG. 15, control for generating maximum braking force from the beginning or a control pattern for generating constant braking force can be adopted. Furthermore, the operating device shown in FIG. 1 is not limited to the time of full braking used together with brake operation using the pedal. In other words, it is a matter of course that the operating device can be applied to a brake operating switch provided in the steering tool adopted heretofore instead of to brake operation using the pedal. According to this, it is possible to eliminate or reduce the lag in operating the brake even for a driver who cannot use the motion ability of the foot or an aged driver having a lowered motion ability of the foot.

Figure 16:
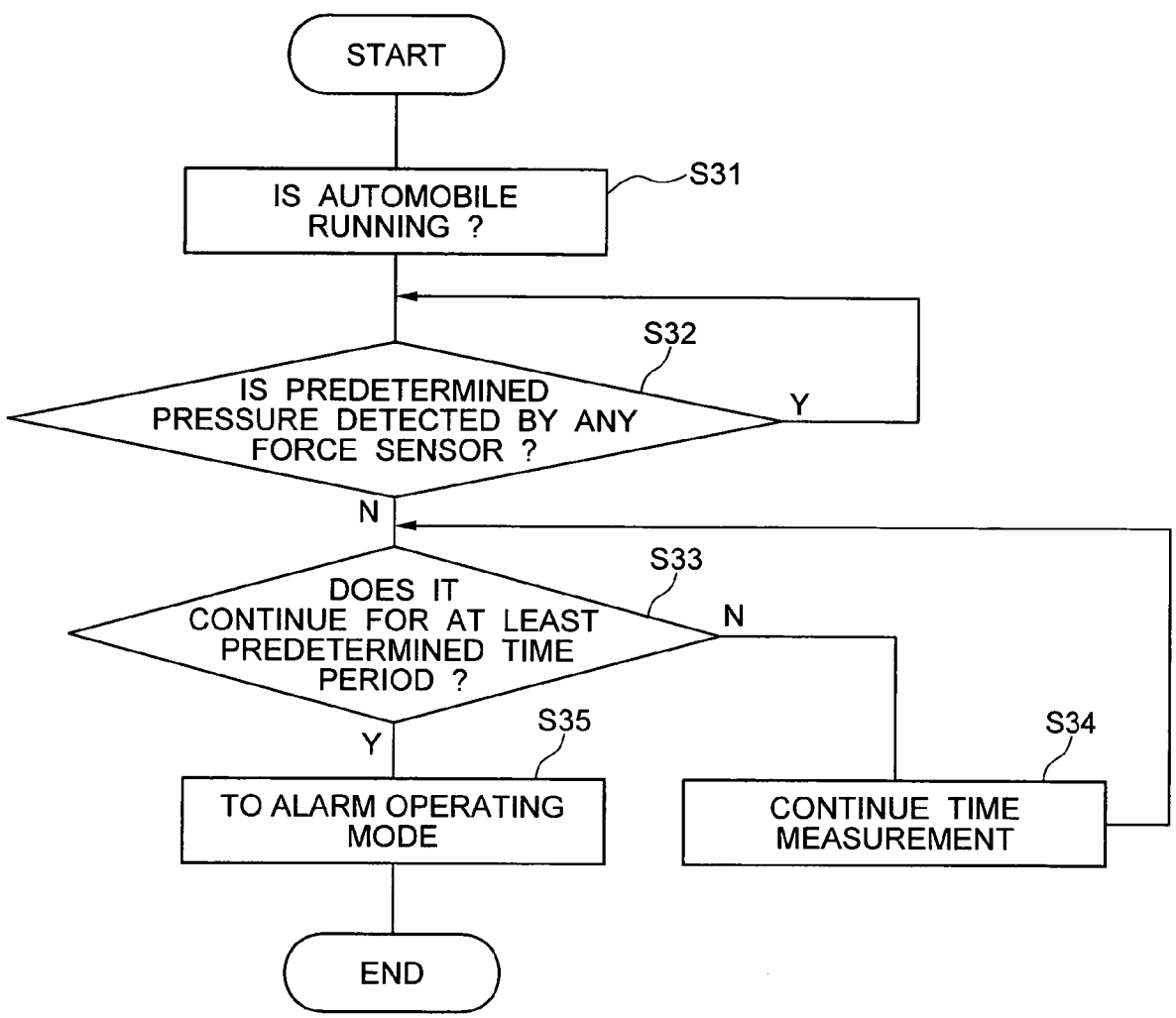
FIG. 16 is a flowchart showing a control procedure in an eighth embodiment in which letting go a driver's hold of a steering wheel is detected by using an operating device for on-vehicle equipment according to the present invention and an alarm is issued.

In addition, as shown in FIG. 13, the controller 4 in the seventh embodiment detects the case where the driver does not grasp the steering wheel 1, outputs an operating signal to an alarm device controller 8, and activates an alarm device 9 to arouse the driver's attention. A processing procedure of the controller 4 at this time is shown in FIG. 16. In other words, on condition that the automobile should be running (S31), on the basis of output signals of the force sensors 2 (S32), provided that the grip force of the steering wheel 1 is lower than a predetermined value and the grip force continues for at least a preset time (S33 and S34), the controller 4 judges that the driver does not grip the steering wheel 1, and activates the alarm device 9 to generate an alarm to the driver (S35). As for the alarm device 9, there is a device, such as a speaker or chime, using voice attached to the vehicle, or a device, such as a vibrator or pin, using the sense of touch incorporated in the driver's seat or the steering wheel.

Eighth Embodiment

The first to eighth embodiments have been described with reference to the force sensor 2 using a change in capacitance shown in FIG. 2. However, the force sensor according to the present invention is not limited to this, but the grip force or pressure can be detected by using strain sensors such as strain gauges as shown in FIGS. 17A and 17B.

Figure 17A:
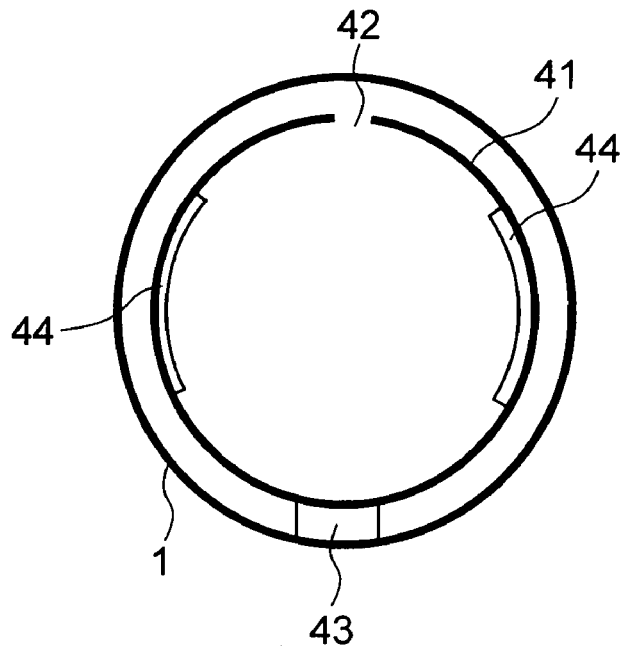
FIGS. 17A and 17B are configuration diagrams of another embodiment of force sensors according to the present invention.

As shown in a sectional view of the steering wheel 1 in FIG. 17A, a cylindrical thin plate 41 having an open section provided with a slit 42 in an axis direction is incorporated within a cylindrical section of the steering wheel 1. A region of the thin plate 41 opposite to the slit 42 is fixed to the steering wheel 1 via a fixing member 43. In addition, strain gauges 44 are stuck to an inner cylindrical face of the thin plate 41.

Figure 17B:
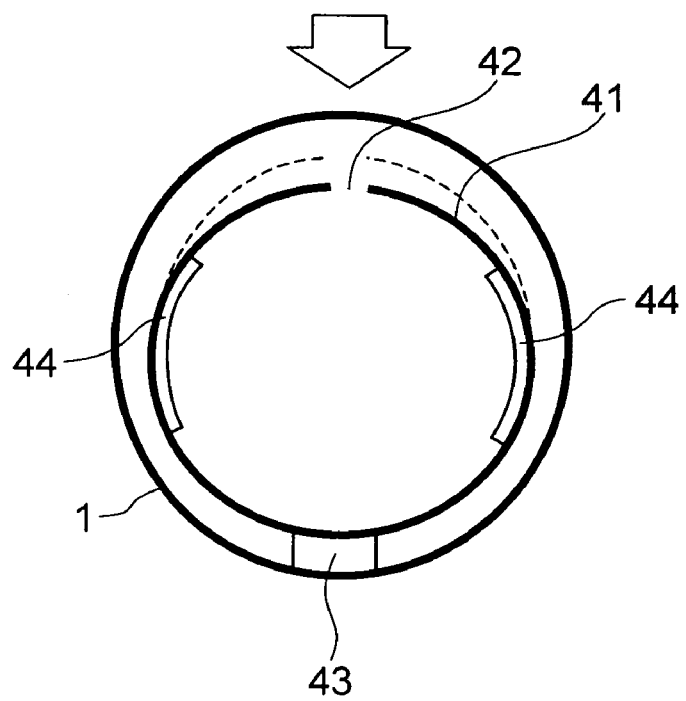

If the driver strongly grasps the steering wheel 1 in such a configuration, the cylindrical thin plate 41 is transformed as shown in FIG. 17B. The grip force or pressure can be detected by detecting the transformation by the use of the strain gauges 44. As for means for detecting the grip force or pressure by the use of the strain gauges, a well-known technique can be applied.

The force sensors 2 can be formed by incorporating pressure sensitive sheets or electrostriction elements besides the strain gauges 44 in the steering wheel 1. In this case, the electrostriction elements can detect only a change at the time of input. Therefore, the electrostriction elements are limited to those capable of conducting the input operation based on input signal detection in a short time.

Ninth Embodiment

Figure 18:
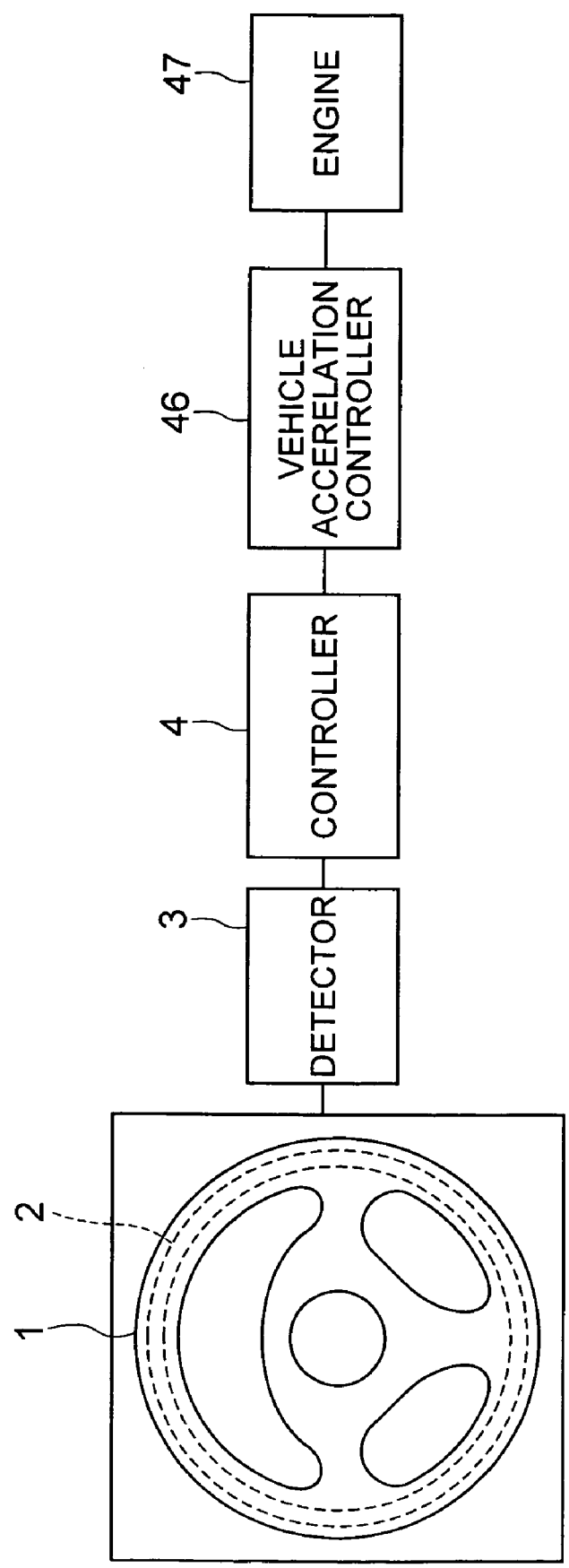
FIG. 18 is a general configuration diagram of a ninth embodiment in which an operating device for on-vehicle equipment according to the present invention.

FIG. 18 shows a general configuration diagram of a ninth embodiment of an operating device for on-vehicle equipment according to the present invention. The present embodiment differs from the first embodiment shown in FIG. 1 that the subject to be operated is an accelerator device of a vehicle. Other points are the same as those in the first embodiment. Therefore, parts having the same functions and configurations are denoted by like reference characters, and description of them will be omitted.

The present embodiment has a feature that all of four force sensors 2A to 2D provided over nearly the entire circumference of the steering wheel 1 shown in FIG. 1 are used as accelerator operating sensors. In other words, if the controller 4 judges that accelerator is operated on the basis of the output signals of the force sensors 2A to 2D as shown in FIG. 18, the controller 4 sends an operating signal to a vehicle acceleration controller 46 to control an engine 47.

Figure 19:
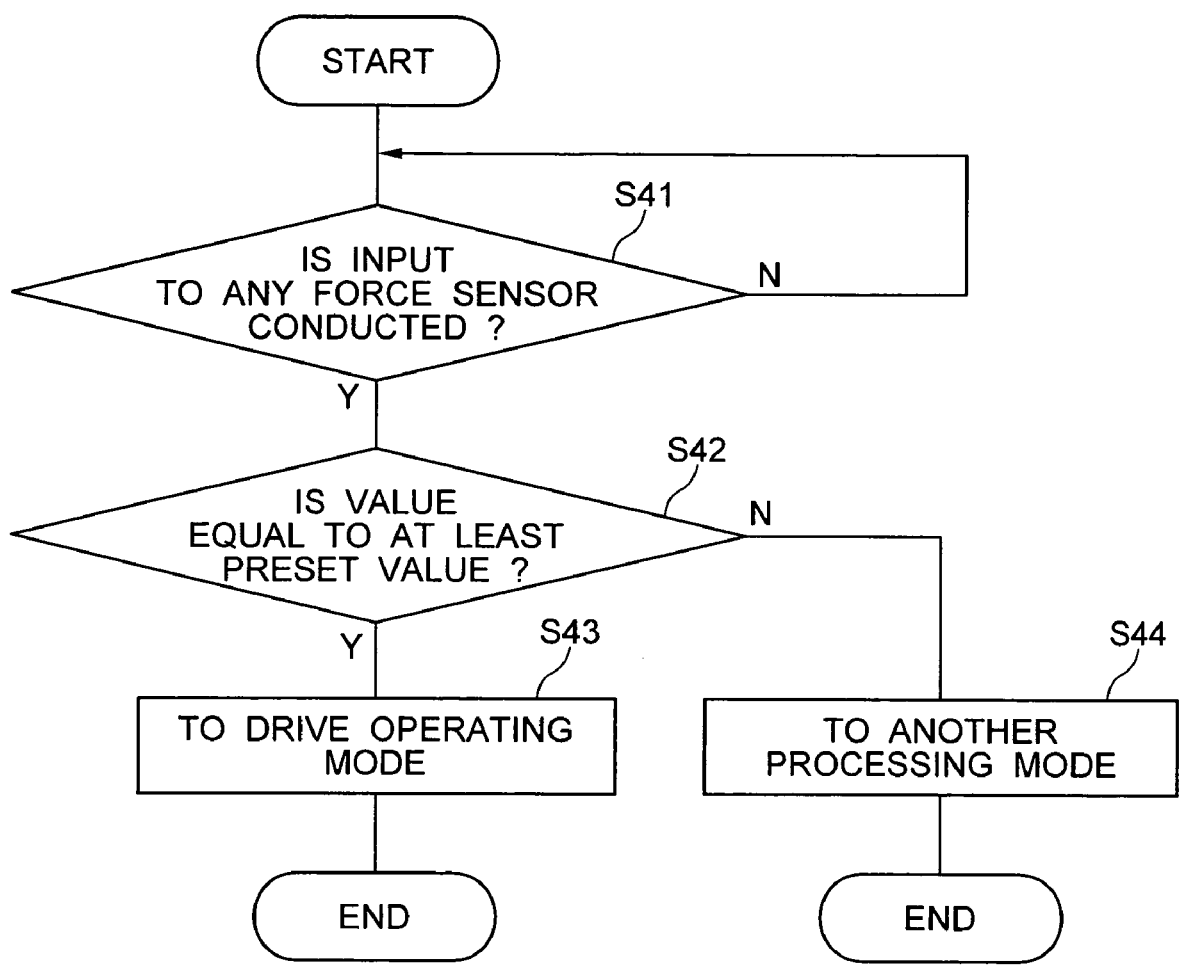
FIG. 19 is a diagram showing an example of a control method in accelerator control in the ninth embodiment.

Operation conducted by the controller 4 at this time will now be described with reference to a flowchart shown in FIG. 19. If a detection signal from at least one force sensor 2 is input from the detector 3 to the controller 4 (S41), then the controller 4 determines whether the input detection signal exhibits operating force which is at least a predetermined preset value. If the result is affirmative (S42), then the controller 4 judges the operation to be accelerator operation and shifts to a drive operating mode (S43). As for the detection of the magnitude of the operating force, the operating force can be calculated by quantitatively finding the pressure applied to the force sensors 2 provided that operating force associated with the output voltage Vout of the force sensors 2 is found by calibration beforehand. In the case of the drive operating mode, the controller 4 sends an operating signal to the vehicle acceleration controller 46 to increase the fuel and accelerate the engine 47. If the controller 4 judges the operation not to be the drive operating mode, then the controller 4 judges the operation to be another operation for the on-vehicle equipment described with reference to the second embodiment or the like, and conducts associated operation processing (S44).

Figure 20:
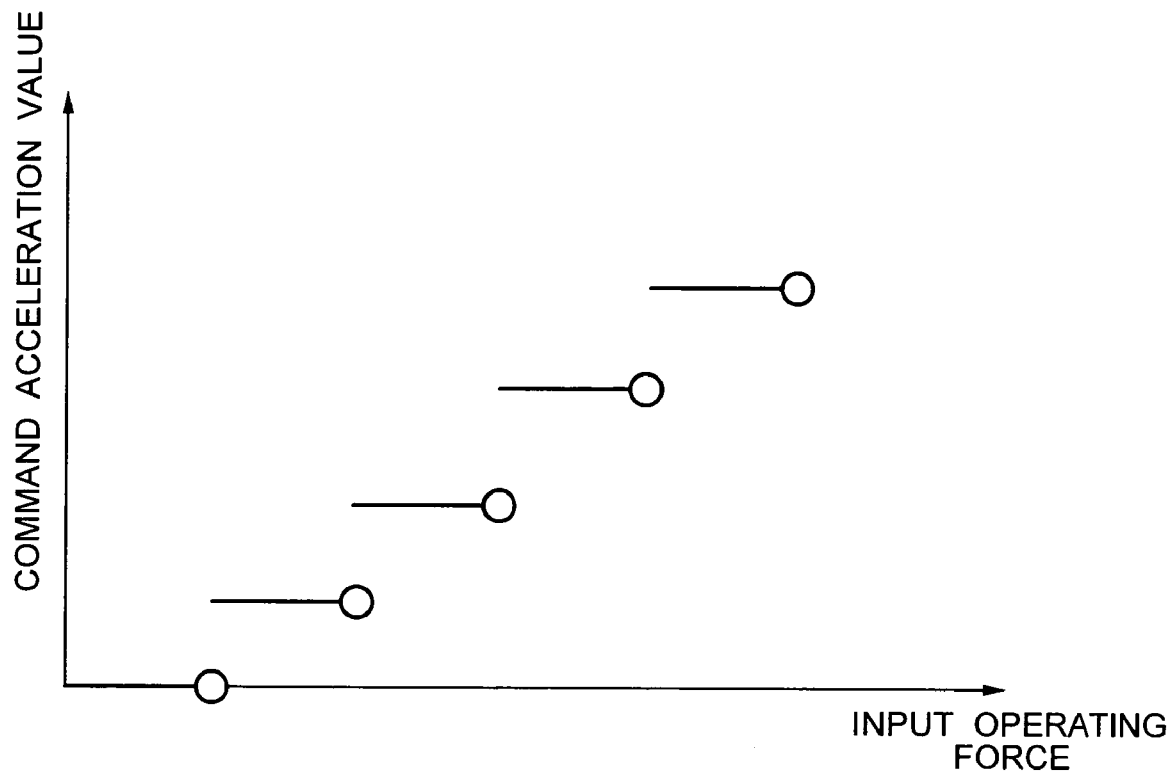
FIG. 20 is a diagram showing an example of a correspondence relation between operating force and an ordered acceleration value in accelerator control in the ninth embodiment.

Acceleration control in the vehicle acceleration controller 46 will now be described with reference to FIG. 20. In the vehicle acceleration controller 46, a command acceleration value is preset so as to be associated with operating force input from the controller 4 as shown in FIG. 20. In the illustrated example, a constant command acceleration value is preset for operating force in a certain range, resulting in a stepwise change. The engine 47 conducts acceleration operation associated with the command acceleration value. In the present embodiment, an example in which the range or the increase in command acceleration value is constant is shown. However, the range or the increase value may be different, or another acceleration method can be applied.

Especially, since there is a danger in the vehicle acceleration operation, it is necessary to prevent false operation in the operation of the present embodiment. As for the method for preventing false operation, it is possible to consider a system including a millimeter wave radar or the like attached to a vehicle, and a device for determining whether acceleration operation is effective according to an existence detection signal of a subject around the vehicle obtained by using the millimeter wave radar, and accelerating only when sufficient safety is ascertained.

As another false operation preventing method, it is conceivable that the driver previously selects and changes over whether to reflect the operating input from the steering wheel into actual vehicle operation. In this case, for example, an input changeover switch is disposed around the driver, and the driver changes over the input changeover switch to actually reflect the operating input from the force sensors 2 of the steering wheel 1. If the driver considers that the operating input from the force sensors 2 of the steering wheel 1 is unnecessary, the driver turns off the input changeover switch to prevent the operating input from the force sensors 2 of the steering wheel 1 from being actually reflected. Furthermore, it is possible to provide a system in which the driver is informed of the situation in which the input changeover switch resides, by voice a predetermined time after insertion of a key. As a result, the driver can easily know whether the force sensors 2 of the steering wheel 1 are being used for operating the accelerator. When the input changeover switch is changed over, a voice message to that effect may be emitted.

According to the embodiments of the present invention, it is possible to improve the operability of various pieces of the on-vehicle equipment in automobiles and enhance the safety, regardless of the age or sex of the driver as heretofore described.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An operating device for on-vehicle equipment, comprising:
    force sensors buried in a grasping part of a steering tool on a vehicle;
    a detection module for detecting force acted on the grasping part on the basis of an output signal of each of said force sensors; and
    a control module for outputting an operating signal to a piece of the on-vehicle equipment mounted on the vehicle on the basis of a detected signal supplied from said detection module,
    wherein said control module rejects inputting of the operating signal to the on-vehicle equipment when a steering signal representing that steering is being conducted by the steering tool is input.

2. The operating device for on-vehicle equipment according to claim 1,
    wherein said control module outputs the operating signal to a piece of the on-vehicle equipment on the basis of at least one of output signals of said force sensors detected by said detection module, sequences of the output signals of said force sensors, and combinations of them, and
    wherein the piece of the on-vehicle equipment is at least one of a brake, an accelerator, a power window, an audio device, a car navigation device, an on-vehicle communication system, and an information terminal.

3. The operating device for on-vehicle equipment according to claim 1, wherein said force sensors are configured to detect force in a direction different from that of steering force, from forces of hands and fingers acted on the steering tool.

4. The operating device for on-vehicle equipment according to claim 1, wherein said force sensors are configured to detect force in a direction substantially perpendicular to a contact face of the hands or fingers that grasp the steering tool.

5. The operating device for on-vehicle equipment according to claim 1, wherein said force sensors are formed by burying a pair of conductor foils having a dielectric layer between, along a grasping face of the steering tool, and said detection module detects force acted on the grasping part, on the basis of capacitance between the pair of conductor foils.

6. The operating device for on-vehicle equipment according to claim 1, wherein said force sensors are strain sensors.

7. The operating device for on-vehicle equipment according to claim 1, wherein said control module comprises a decision module for judging the detected signal to be a brake operating signal when a signal level of the detected signal has exceeded a second preset level preset higher than the first preset level.

8. The operating device for on-vehicle equipment according to claim 1, wherein operating contents of a piece of the on-vehicle equipment according to each of said force sensors are exhibited on a surface of a region of the grasping part in which the force sensor is buried.

9. The operating device for on-vehicle equipment according to claim 1, wherein said control module comprises a module for selecting and changing over the piece of the on-vehicle equipment operated by the operating signal on the basis of the detected signal.

10. The operating device for on-vehicle equipment according to claim 1, wherein said control module comprises an input changeover module for selecting whether to output the operating signal to the piece of the on-vehicle equipment.

11. The operating device for on-vehicle equipment according to claim 1,
    wherein said control module outputs the operating signal to a piece of the on-vehicle equipment on the basis of at least one of output signals of said force sensors detected by said detection module, sequences of the output signals of said force sensors, and combinations of them.

12. The operating device for on-vehicle equipment according to claim 1, wherein the piece of the on-vehicle equipment is at least one of a brake, an accelerator, a power window, an audio device, a car navigation device, an on-vehicle communication system, and an information terminal.

* * * * *

UNITED STATES PATENT AND TRADEMARK OFFICE
CERTIFICATE OF CORRECTION

PATENT NO. : 7,649,278 B2  Page 1 of 1
APPLICATION NO. : 11/519943
DATED : January 19, 2010
INVENTOR(S) : Yoshida et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 443 days.

Signed and Sealed this

Twenty-eighth Day of December, 2010

David J. Kappos
*Director of the United States Patent and Trademark Office*